(12) United States Patent
Xin et al.

(10) Patent No.: US 11,460,942 B2
(45) Date of Patent: Oct. 4, 2022

(54) DISPLAY PANEL AND DISPLAY APPARATUS

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Yu Xin, Shanghai (CN); Lijing Han, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/367,158

(22) Filed: Jul. 2, 2021

(65) Prior Publication Data
US 2021/0333917 A1    Oct. 28, 2021

(30) Foreign Application Priority Data
May 13, 2021 (CN) .................. CN202110520283.2

(51) Int. Cl.
G06F 3/041 (2006.01)
G06F 3/044 (2006.01)
H01L 27/32 (2006.01)

(52) U.S. Cl.
CPC .......... *G06F 3/0412* (2013.01); *G06F 3/0446* (2019.05); *H01L 27/323* (2013.01); *H01L 27/3218* (2013.01); *G06F 2203/04111* (2013.01); *H01L 27/3216* (2013.01); *H01L 27/3244* (2013.01)

(58) Field of Classification Search
CPC ......... G06F 2203/04111; G06F 3/0412; G06F 3/0446; G06F 3/0448; G06F 3/044; H01L 27/323; H01L 27/3216; H01L 27/3218; H01L 27/3244
See application file for complete search history.

(56) References Cited

U.S. PATENT DOCUMENTS

2015/0277627 A1 * 10/2015 Pang ..................... G06F 3/0446
                                                                        345/174
2017/0344162 A1 * 11/2017 Lee ......................... G06F 3/0443

FOREIGN PATENT DOCUMENTS

CN        102200856 A        9/2011
CN        102253776 A        11/2011

* cited by examiner

*Primary Examiner* — Lisa S Landis
(74) *Attorney, Agent, or Firm* — Christensen O'Connor Johnson Kindness PLLC

(57) ABSTRACT

Provided are a display panel and a display apparatus. A display layer includes pixel columns arranged along a first direction, and the pixel column includes subpixels arranged along a second direction. A first touch unit in a touch layer includes a bridge and first touch electrodes. An acute angle is formed between an extending direction of the bridge and the second direction. N subpixels are sequentially arranged along a preset direction, along which first and second edges of each subpixel are oppositely disposed. D2≤L≤D1. L denotes a length of each of the at least one bridge. An orthographic projection of the bridge on a plane of the substrate overlaps M subpixels. 0≤M<(N−2).

23 Claims, 25 Drawing Sheets

DISPLAY PANEL AND DISPLAY APPARATUS

CROSS-REFERENCE TO RELATED DISCLOSURES

The present application claims priority to Chinese Patent Application No. 202110520283.2, filed on May 13, 2021, the content of which is incorporated herein by reference in its entirety.

TECHNICAL FIELD

The present disclosure relates to the field of display technologies, and in particular, to a display panel and a display apparatus.

BACKGROUND

In recent years, with the rapid development of digital information and wireless mobile communication technologies, a touch screen instead of a traditional keyboard or mouse is used as an input device for many electronic products such as mobile phones, for the sake of lightweight and portability.

A touch unit in the touch screen will affect light emission of a subpixel in a display panel. Therefore, research has focused on preventing or limiting the display panel from being affected and reducing such effects of the touch unit on the display panel, while realizing a touch function of the display panel.

SUMMARY

According to a first aspect, an embodiment of this disclosure provides a display panel. The display panel includes a substrate, a display layer located on a side of the substrate, and a touch layer located on a side of the display layer facing away from the substrate. The display layer includes pixel columns arranged along a first direction, each of the pixel columns includes at least two subpixels of subpixels, the at least two subpixel are arranged along a second direction, and the first direction and the second direction intersect. The touch layer includes first touch units, each of the first touch units includes a bridge group and at least two first touch electrodes, the at least two first touch electrodes are arranged along a third direction, the bridge group includes at least one bridge, and one of the at least one bridge is electrically connected to two of the at least two first touch electrodes. An acute angle α is formed between an extending direction of one of the at least one bridge and the second direction. For N subpixels of the subpixels sequentially arranged along a preset direction, each of the N subpixels includes a first edge and a second edge that are oppositely disposed along the preset direction, and D2≤L≤D1, where D1 denotes a distance from the second edge of a $1^{st}$ subpixel of the N subpixels and the first edge of an $N^{th}$ subpixel of the N subpixels, D2 denotes a distance from the second edge of a $2^{nd}$ subpixel of the N subpixels to the first edge of an $(N-1)^{th}$ subpixel of the N subpixels, and L denotes a length of each of the at least one bridge. An orthographic projection of each of the at least one bridge on a plane of the substrate overlaps M subpixels of the subpixels, where 0≤M<(N−2), N is an integer greater than 2, and M is an integer. The preset direction is parallel to the plane of the substrate.

According to a second aspect, an embodiment of this disclosure provides a display apparatus, and the display apparatus includes a display panel. The display panel includes a substrate, a display layer located on a side of the substrate, and a touch layer located on a side of the display layer facing away from the substrate. The display layer includes pixel columns arranged along a first direction, each of the pixel columns includes at least two subpixels of subpixels, the at least two subpixel are arranged along a second direction, and the first direction and the second direction intersect. The touch layer includes first touch units, each of the first touch units includes a bridge group and at least two first touch electrodes, the at least two first touch electrodes are arranged along a third direction, the bridge group includes at least one bridge, and one of the at least one bridge is electrically connected to two of the at least two first touch electrodes. An acute angle α is formed between an extending direction of one of the at least one bridge and the second direction. For N subpixels of the subpixels sequentially arranged along a preset direction, each of the N subpixels includes a first edge and a second edge that are oppositely disposed along the preset direction, and D2≤L≤D1, where D1 denotes a distance from the second edge of a $1^{st}$ subpixel of the N subpixels and the first edge of an $N^{th}$ subpixel of the N subpixels, D2 denotes a distance from the second edge of a $2^{nd}$ subpixel of the N subpixels to the first edge of an $(N-1)^{th}$ subpixel of the N subpixels, and L denotes a length of each of the at least one bridge. An orthographic projection of each of the at least one bridge on a plane of the substrate overlaps M subpixels of the subpixels, where 0≤M<(N−2), N is an integer greater than 2, and M is an integer. The preset direction is parallel to the plane of the substrate.

BRIEF DESCRIPTION OF THE DRAWINGS

To describe the technical solutions of the embodiments of the present disclosure more clearly, the following briefly describes the accompanying drawings required in the embodiments. The accompanying drawings in the following description show merely some examples of the present disclosure, and a person of ordinary skill in the art can still derive other drawings from these accompanying drawings without creative efforts.

DETAILED DESCRIPTION

For a better understanding of the technical solutions of the present disclosure, the following describes in detail the embodiments of the present disclosure with reference to the accompanying drawings.

It should be noted that, the described embodiments are merely some but not all of the embodiments of the present disclosure. All other embodiments obtained by a person of ordinary skill in the art based on the embodiments of the present disclosure shall fall within the protection scope of the present disclosure.

Terms used in the embodiments of the present disclosure are only for describing specific embodiments, and are not intended to limit this disclosure. Unless otherwise specified in the context, words such as "a", "the", and "said" in a singular form in the embodiments of the present disclosure and the appended claims include plural forms.

It should be understood that, the term "and/or" used in this specification describes only an association relationship of associated objects and represents that three relationships can exist. For example, A and/or B can represent the following three cases: A alone, both A and B, and B alone. In addition, the character "I" in this specification generally indicates an "or" relationship between the associated objects.

It should be understood that although the terms such as first, and second can be used to describe bridges in the embodiments of the present disclosure, these bridges should not be limited to these terms. These terms are used only to distinguish the bridges from each other. For example, without departing from the scope of the embodiments of the present disclosure, a first bridge can also be referred to as a second bridge, and similarly, a second bridge can also be referred to as a first bridge.

Figure 1:
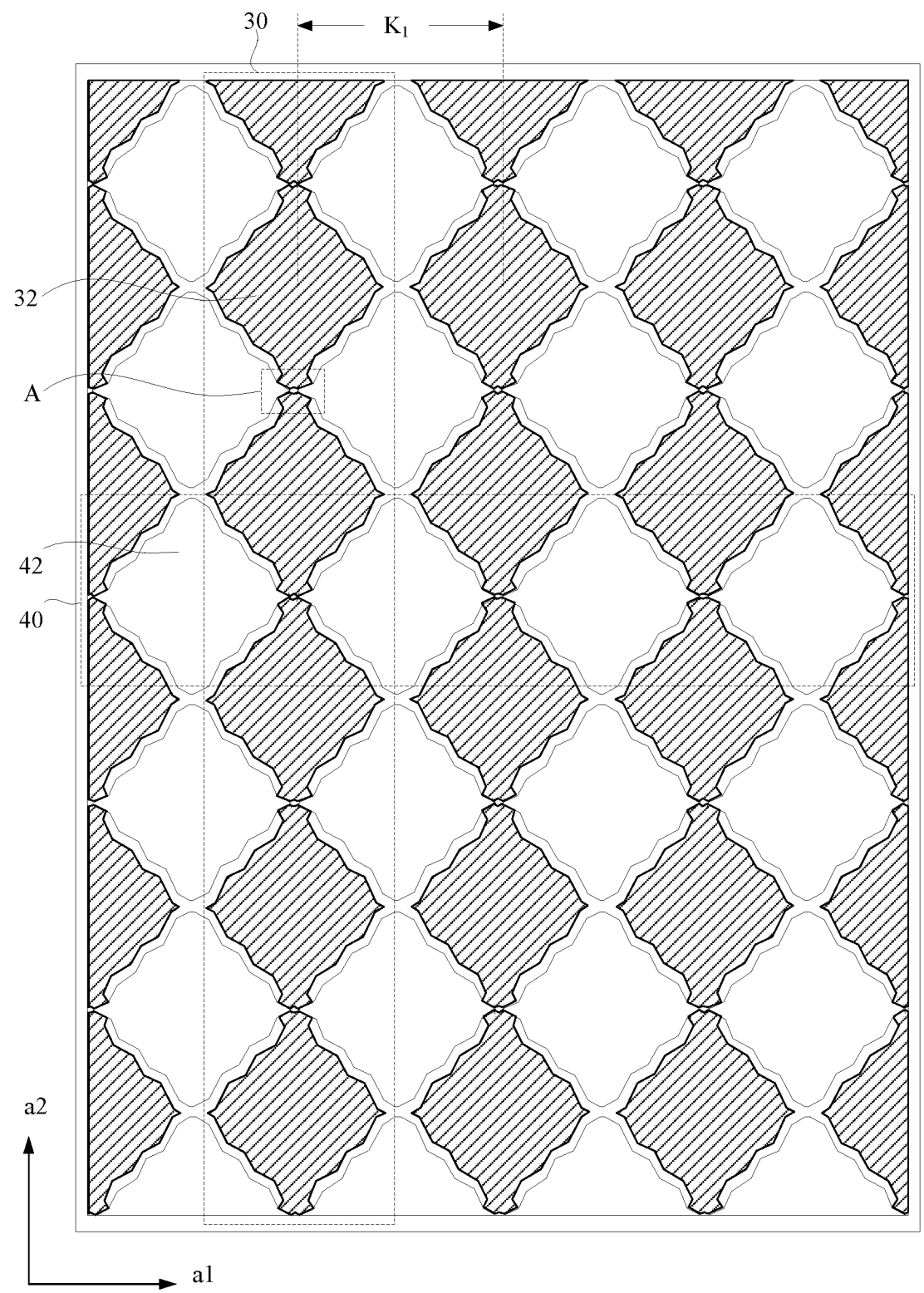
FIG. 1 is a top view of a display panel according to an embodiment of the present disclosure.
Figure 2:
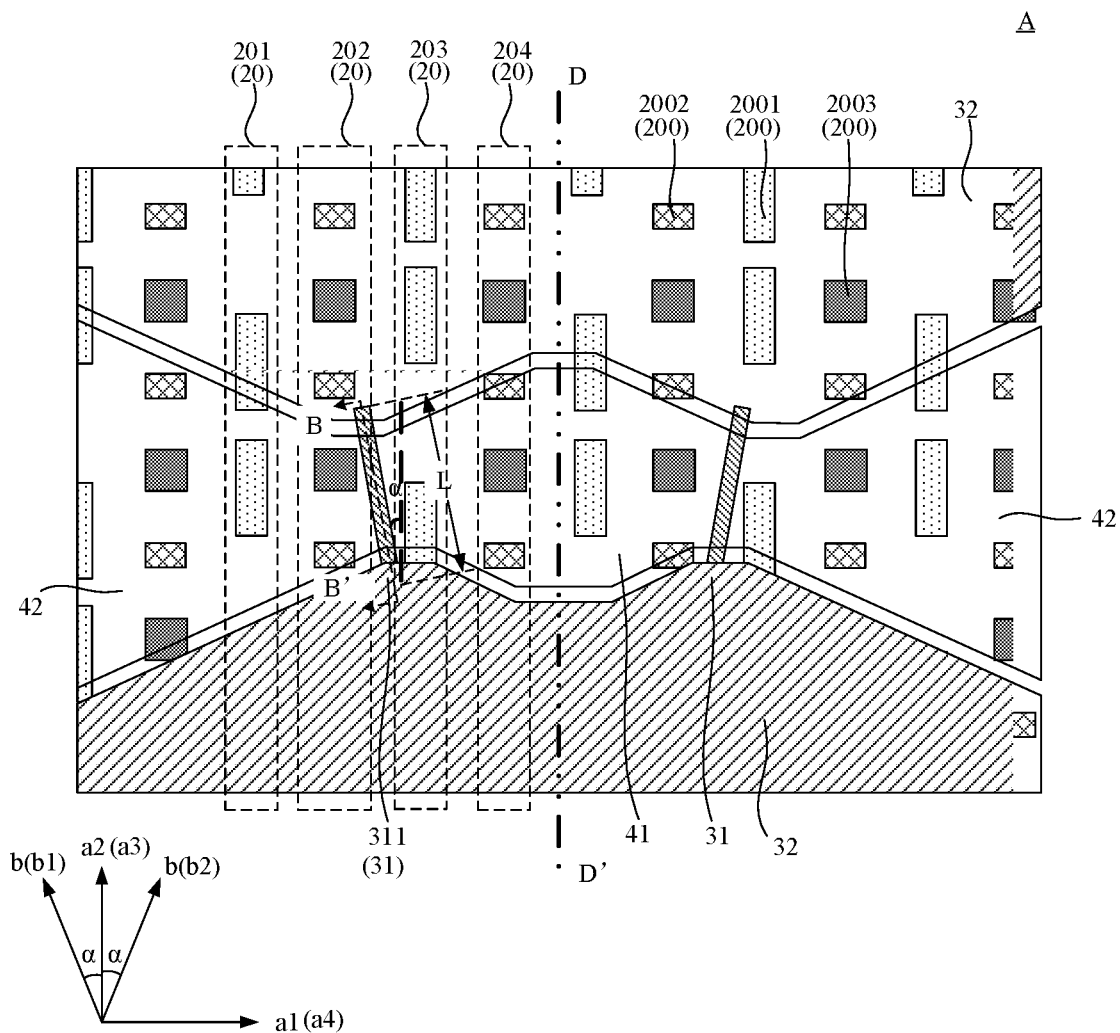
FIG. 2 is an enlarged schematic view of a region A in FIG. 1 according to an embodiment of the present disclosure.
Figure 3:
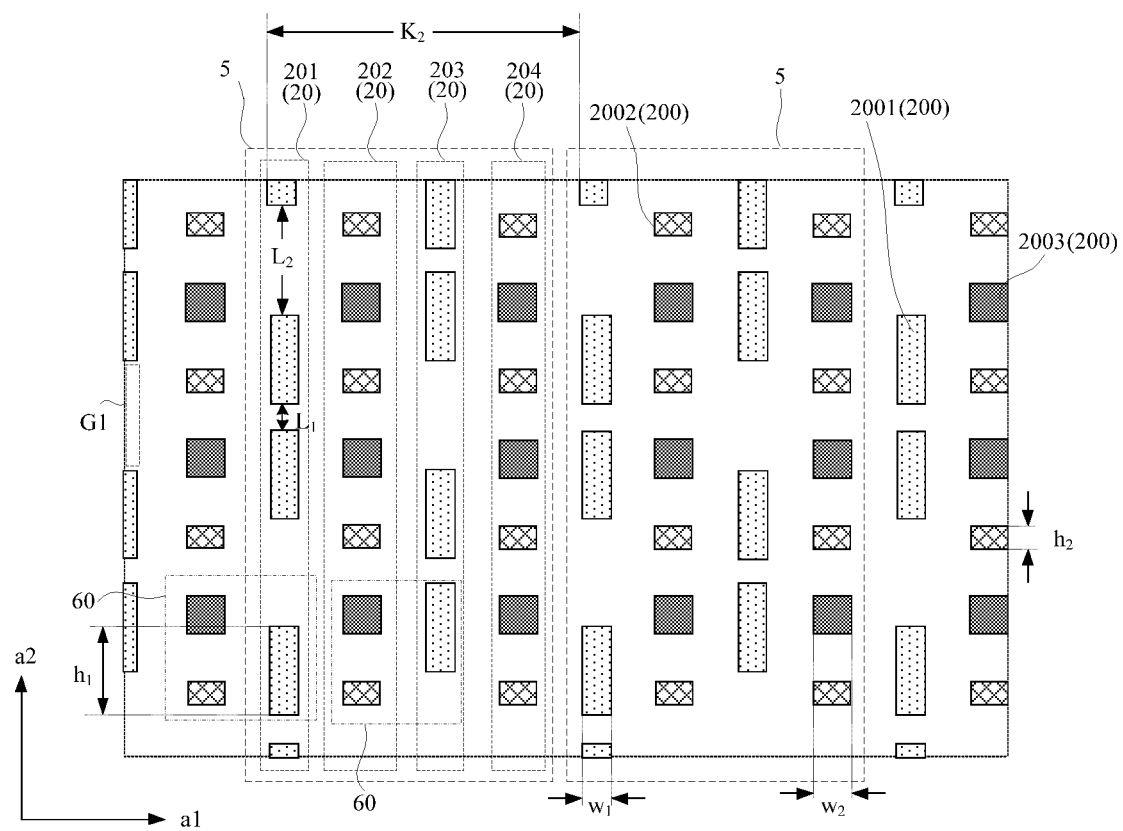
FIG. 3 is a top view of a display layer in a region A in FIG. 1 according to an embodiment of the present disclosure.
Figure 4:
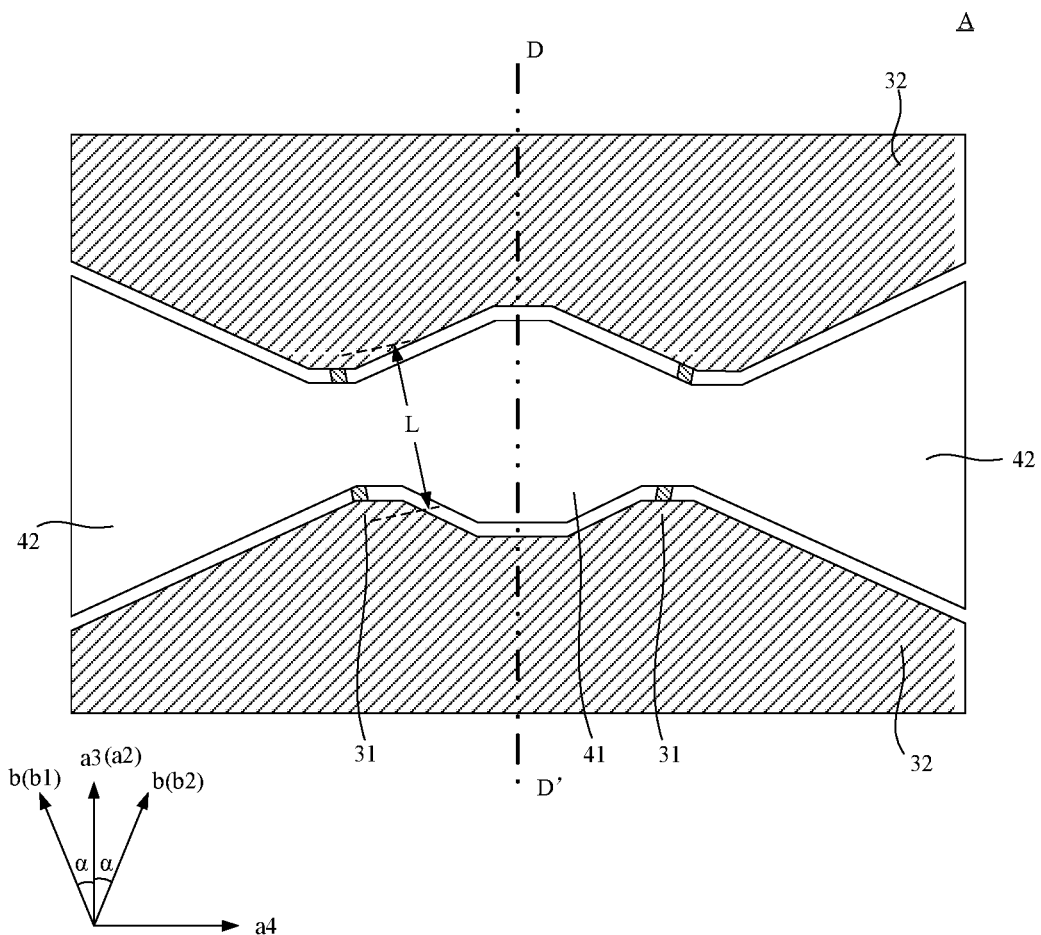
FIG. 4 is a top view of a touch layer in a region A in FIG. 1 according to an embodiment of the present disclosure.
Figure 5:
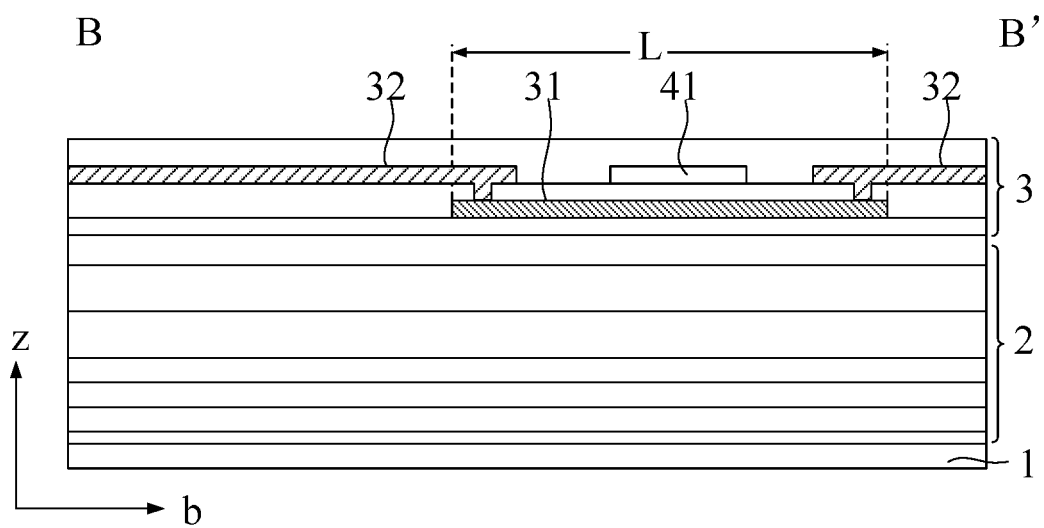
FIG. 5 is a schematic cross-sectional view of FIG. 2 along BB' according to an embodiment of the present disclosure.

An embodiment of the present disclosure provides a display panel. FIG. 1 is a top view of a display panel according to an embodiment of the present disclosure, FIG. 2 is an enlarged schematic view of a region A in FIG. 1, FIG. 3 is a top view of a display layer in a region A in FIG. 1, FIG. 4 is a top view of a touch layer in a region A in FIG. 1, and FIG. 5 is a schematic cross-sectional view of FIG. 2 along BB'. As shown in FIG. 1 to FIG. 5, the display panel includes a substrate 1, a display layer 2, and a touch layer 3. The display layer 2 is located on a side of the substrate 1. The touch layer 3 is located on a side of the display layer 2 facing away from the substrate 1. In other words, the substrate 1, the display layer 2, and the touch layer 3 are stacked along a thickness direction z of the display panel. In an embodiment of the present disclosure, the display layer 2 can include stacked display sublayers. The touch layer 3 can include stacked touch sublayers.

As shown in FIG. 2 and FIG. 3, the display layer 2 includes a plurality of pixel columns 20 arranged along a first direction a1, and the pixel column 20 includes a plurality of subpixels 200 arranged along a second direction a2. The first direction a1 and the second direction a2 intersect. For example, the first direction a1 can be perpendicular to the second direction a2.

As shown in FIG. 1, FIG. 2, FIG. 4, and FIG. 5, the display panel provided in an embodiment of the present disclosure can be of a mutual-capacitance touch structure. The touch layer 3 can include a plurality of first touch units 30 and a plurality of second touch units 40.

The first touch unit 30 includes a bridge group and at least two first touch electrodes 32. The at least two first touch electrodes 32 are arranged along a third direction a3. The plurality of first touch units 30 is arranged along a fourth direction a4. The bridge group includes at least one bridge 31, and the bridge 31 is electrically connected to two adjacent first touch electrodes 32 in a same first touch unit 30 as the bridge 31. The third direction a3 and the fourth direction a4 intersect. For example, the third direction a3 can be perpendicular to the fourth direction a4.

The second touch unit 40 can include a connection portion 41 and at least two second touch electrodes 42, the at least two second touch electrodes 42 are arranged along the fourth direction a4. The plurality of second touch units 40 is arranged along the third direction a3. The connection portion 41 is electrically connected to two adjacent second touch electrodes 42 in a same second touch unit 40 as the connection portion 41.

In an embodiment, the first touch unit 30 can be used as a touch driving electrode, and the second touch unit 40 can be used as a touch sensing electrode. In an embodiment, the first touch unit 30 can be used as a touch sensing electrode, and the second touch unit 40 can be used as a touch driving electrode. This is not limited in this embodiment of the present disclosure.

For example, as shown in FIG. 5, the touch layer 3 in an embodiment of the present disclosure can include a plurality of touch sublayers. The first touch electrode 32 and the bridge 31 can be located in different touch sublayers, and an insulating layer is disposed between the first touch electrode 32 and the bridge 31. In an embodiment of the present disclosure, a via hole is provided in the insulating layer, to connect the first touch electrode 32 and the bridge 31. FIG. 4 and FIG. 5 only show schematic position relationships between the first touch electrode 32 and the bridge 31 in their corresponding layer. In an actual design process of the display panel, as shown in FIG. 4 and FIG. 5, the first touch electrode 32 can be located at a side of the bridge 31 away from the substrate 1. In another embodiment, the bridge 31 can be located at a side of the first touch electrode 32 away from the substrate 1. This is not limited in this embodiment of the present disclosure.

In an embodiment, as shown in FIG. 5, the first touch electrode 32, the second touch electrode 42, and the connection portion 41 can be located in a same touch sublayer. The first touch electrode 32, the second touch electrode 42, and the connection portion 41 can be manufactured by using a same patterning process.

In an embodiment of the present disclosure, a length of the bridge 31 is L, and L can be set based on different design requirements. For example, the length L of the bridge 31 can be set by comprehensively considering a distance between two adjacent first touch electrodes 32, a conductive property of the first touch electrode 30, and other factors.

The embodiment of the present disclosure does not limit a relative relationship between an arrangement of the first touch unit 30 and the second touch unit 40 in the touch layer 3, and an arrangement of the subpixel 200 in the display layer 2. For example, in an embodiment of the present disclosure, the third direction a3 can be set to be parallel to the first direction a1 or the second direction a2, or the third direction a3 can be set to intersect both the first direction a1 and the second direction a2. In FIG. 2, for example, the third direction a3 is parallel to the second direction a2, and the fourth direction a4 is parallel to the first direction a1.

In an embodiment of the present disclosure, as shown in FIG. 2, an acute angle α is formed between an extending direction b of the bridge 31 and the second direction a2. As shown in FIG. 2, that the acute angle α is formed between the bridge 31 and the second direction a2 indicates that when the second direction a2 is fixed, the extending direction b of the bridge includes a first extending direction b1 shown in FIG. 2 and can also include a second extending direction b2 shown in FIG. 2. An orientation shown in FIG. 2 is used as an example. The first extending direction b1 can be regarded as a direction obtained by rotating the second direction a2 counterclockwise by α, and the second extending direction b2 can be regarded as a direction obtained by rotating the second direction a2 clockwise by α.

In an embodiment, N subpixels 200 sequentially arranged along a preset direction a0 are located in the display layer 2. For the N subpixels 200, any one of the N subpixels 200 includes a first edge 21 and a second edge 22 that are oppositely disposed along the preset direction a0, a distance between the second edge 22 of a $1^{st}$ subpixel 200 of the N subpixels 200 and the first edge 21 of an $N^{th}$ subpixel 200 of the N subpixels 200 is D1, and a distance between the second edge 22 of a $2^{nd}$ subpixel 200 of the N subpixels 200 and the first edge 21 of an $(N-1)^{th}$ subpixel 200 of the N subpixels 200 is D2. The preset direction a0 is parallel to a plane of the substrate 1. The length L, the distance D1, and the distance D2 satisfy the following condition: $D2 \leq L \leq D1$. That the N subpixels 200 sequentially arranged along the preset direction a0 indicates that a straight line connecting centers of the N subpixels is parallel or substantially parallel to the preset direction a0. In actual production, there will be a certain process error between an actual position and/or shape of the subpixel 200 and a designed position and/or shape. Therefore, that the straight line connecting the centers of the N subpixels is substantially parallel to the preset direction a0 is also included in the protection scope of the present disclosure, provided that a display effect is not affected and the process error is within an error range allowed by the process.

In an embodiment of the present disclosure, the display panel can be a liquid crystal display (LCD) panel. In an embodiment, the display panel can be another display panel using a self-illumination technology, for example, can be any one of an organic light emitting diode (OLED) display panel, a micro light emitting diode (micro-LED) display panel, and a quantum light emitting diode (QLED) display panel, which is not limited in the embodiment of the present disclosure.

Figure 6:
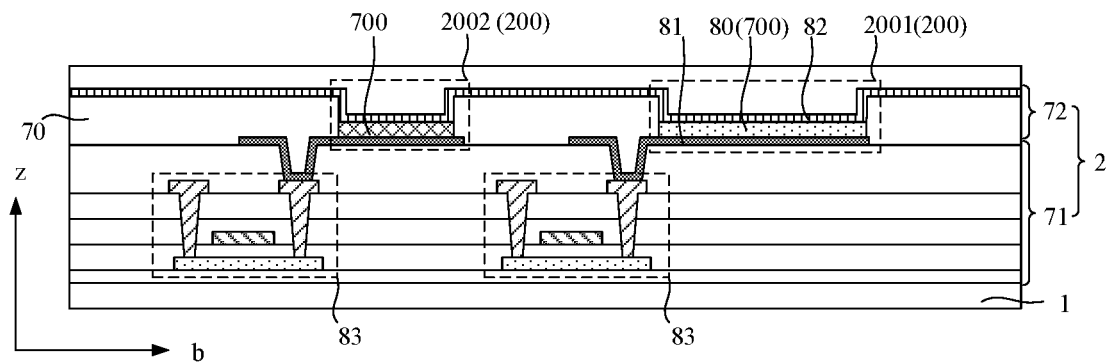
FIG. 6 is a schematic cross-sectional view of a display layer according to an embodiment of the present disclosure.

A region in which the subpixel 200 is located is a region in which light can be emitted in a display region of the display panel, and a center of an orthographic projection of the subpixel 200 on the plane of the substrate is a center of the region in which the light can be emitted. For example, the display panel is an OLED display panel. FIG. 6 is a schematic cross-sectional view of a display layer according to an embodiment of the present disclosure. As shown in FIG. 6, the display layer 2 can include a drive circuit layer 71 and a display function layer 72. The drive circuit layer 71 includes a film transistor 83. The display function layer 72 includes a first electrode 81, a pixel definition layer 70, a light emitting layer 80, and a second electrode 82. The pixel definition layer 70 includes an opening 700, and the light emitting layer 80 is at least partially located within the opening 700. Unless otherwise specified below, a center of an orthographic projection of the subpixel 200 on a plane of the display panel is a center of an orthographic projection of the opening 700 on the plane of the display panel. When a shape of an orthographic projection of the opening 700 on the plane of the substrate 1 is a regular pattern, the center of the orthographic projection of the opening 700 on the plane of the substrate 1 is a geometric center of the orthographic projection of the opening 700 on the plane of the substrate 1.

Figure 7:
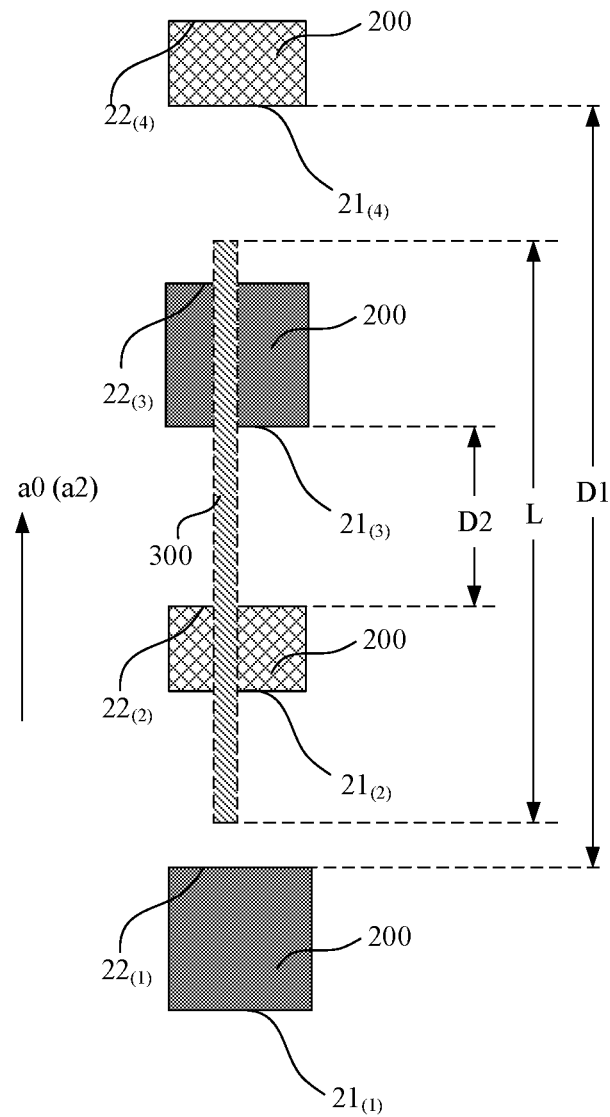
FIG. 7 is a schematic view of a preset direction parallel to a second direction according to an embodiment of the present disclosure.

FIG. 7 is a schematic view in which the preset direction a0 is parallel to the second direction a2 and the preset direction a0 has a single direction indicated by an arrow shown in FIG. 7. In an embodiment, as shown in FIG. 7, N=4. To describe the solutions in this specification more clearly, the first edge of a $1^{st}$ subpixel 200 of the four subpixels 200 sequentially arranged along the preset direction a0 is denoted as $21_{(1)}$, the second edge of the $1^{st}$ subpixel 200 of the four subpixels 200 sequentially arranged in the preset direction a0 is denoted as $22_{(1)}$, the first edge of a $2^{nd}$ subpixel 200 of the four subpixels 200 sequentially arranged in the preset direction a0 is denoted as $21_{(2)}$, the second edge of the $2^{nd}$ subpixel 200 of the four subpixels 200 sequentially arranged in the preset direction a0 is denoted as $22_{(2)}$, . . . , the first edge of a $4^{th}$ subpixel 200 of the four subpixels 200 sequentially arranged in the preset direction a0 is denoted as $21_{(4)}$, and the second edge of the $2^{nd}$ subpixel 200 of the four subpixels 200 sequentially arranged in the preset direction a0 is denoted as $22_{(4)}$.

In an embodiment of the present disclosure, an orthographic projection of the bridge 31 on the plane of the substrate 1 overlaps M subpixels 200, and M satisfies the following condition: $0 \leq M < (N-2)$, where N is an integer greater than 2, and M is an integer.

When matching position relationship between the display layer and the touch layer, under a condition that the length L of the bridge is determined and satisfies $D2 \leq L \leq D1$, if the extending direction of the bridge is set to be parallel to the preset direction a0, the bridge with the extending direction parallel to the preset direction a0 is named a contrast bridge in the following to make a distinction. In FIG. 7, a position of a contrast bridge 300 is indicated by a dotted-line border. The contrast bridge 300 extends along the preset direction a0, and its length is L. It can be learned that an orthographic projection of the contrast bridge 300 on the plane of the substrate overlaps (N−2) subpixels, excluding a first subpixel and a last subpixel in the N subpixels.

In an embodiment of the present disclosure, a quantity of subpixels 200 overlapping the orthographic projection of the bridge 31 on the plane of the substrate is set to smaller than (N−2). In this way, when the display panel displays images, a quantity of subpixels 200 with light emitting affected by the bridge 31 is reduced. Light transmittance at a position provided with the bridge 31 is different from that at a position not provided with the bridge 31. Therefore, when a user watches the display panel, display brightness and other optical effects at the position provided with the bridge 31 are different from those at another position, making the bridge 31 visible. In the embodiment of the present disclosure, the quantity M of the subpixels 200 overlapping the orthographic projection of the bridge 31 on the plane of the substrate 1 is limited, which reduces visibility of the bridge 31 and ensures the display effect of the display panel.

In an embodiment of the present disclosure, the quantity M of subpixels 200 overlapping the orthographic projection of the bridge 31 on the plane of the substrate is related to the length L of the bridge 31, the distance D1 between the second edge 22 of the $1^{st}$ subpixel 200 and the first edge 21 of the $N^{th}$ subpixel 200 in the N subpixels 200 sequentially arranged along the preset direction a0, and the distance D2 between the second edge 22 of the $2^{nd}$ subpixel 200 and the first edge 21 of the $(N-1)^{th}$ subpixel 200 in the N subpixels 200 sequentially arranged along the preset direction a0. In other words, a relative position relationship between the bridge 31 and the subpixel 200 is designed comprehensively based on the length L of the bridge 31 in the touch layer 3, an area of the subpixel 200 in the display layer 2, an arrangement rule of the subpixels 200, the distance between the subpixels 200, and other factors. In this way, the quantity of subpixels 200 overlapping the orthographic projection of the bridge 31 on the plane of the substrate can be quantified. On the basis of reducing the visibility of the bridge 31 and ensuring the display effect of the display panel, such design is of a great practical reference significance for how to design the area and the arrangement rule of the subpixel 200 in the display layer 2 to make the display panel achieve different display effects, and how to design area and an arrangement manner of the first touch electrode 32 and the bridge 31 in the touch layer 3 to make the display panel achieve different touch effects.

In an embodiment of the present disclosure, the bridge 31 is tilted relative to an extending direction of the pixel column 20. For example, the acute angle α is formed between the extending direction b of the bridge 31 and an arrangement direction of a plurality of subpixels 200 in a same pixel column 20, namely, the second direction a2. With such configuration, a quantity of the subpixels overlapping the bridge 31 in a same pixel column 20 can be reduced. When the quantity of subpixels overlapping the bridge 31 is determined, positions of the subpixels overlapping the bridge 31 can be distributed in different pixel columns 20, to avoid centralized distribution of subpixels affected by the bridge 31, and reduce the visibility of the bridge 31. To ensure that the bridge 31 overlaps a few subpixels 200 in a same pixel column 20, such configuration can also lower alignment precision requirements of the display layer 2 and the touch layer 3, and reduce the process difficulty. In a process of manufacturing the display panel, precision of alignment between the display layer 2 and the touch layer 3 can be considered. Considering a precision limit of an alignment process, an alignment error is inevitable. Therefore, to keep the bridge away from the subpixels by setting the extending direction of the bridge to be parallel to the second direction a2 and disposing the bridge between two adjacent pixel columns 20 along the first direction a1, a high alignment precision is required. If an alignment deviation occurs, the bridge will overlap a plurality of subpixels 200 in a same pixel column 20. As a result, the bridge can be observed by a human eye. It can be learned that in such configuration provided in the embodiment of the present disclosure, the bridge 31 is tilted relative to the extending direction of the pixel column 20, which not only can reduce the visibility of the bridge 31, but also can lower the alignment precision requirements of the display layer 2 and the touch layer 3, and thus can reduce the process difficulty and production costs.

In an embodiment of the present disclosure, the first touch electrode 32, the second touch electrode 42, and the connection portion 41 can be made of any one or more of transparent conductive oxides such as indium tin oxide (ITO), indium zinc oxide (IZO), and indium gallium zinc oxide (IGZO). The bridge 31 can be made of a metallic material or a transparent metallic oxide.

In an embodiment of the present disclosure, the subpixels 200 in the display layer 2 can be arranged in a plurality of manners, and details are described below.

For example, as shown in FIG. 3, the pixel columns 20 include a first pixel column 201, a second pixel column 202, a third pixel column 203, and a fourth pixel column 204 that are arranged along the first direction a1. The first pixel column 201, the second pixel column 202, the third pixel column 203, and the fourth pixel column 204 constitute a minimum pixel repeating unit column group 5. In the display region of the display panel, multiple minimum pixel repeating unit column groups 5 are successively arranged along the first direction a1.

The first pixel column 201 and the third pixel column 203 each include first subpixels 2001 arranged along the second direction a2. The second pixel column 202 and the fourth pixel column 204 each include a second subpixel 2002 and a third subpixel 2003 that are alternately arranged along the second direction a2. The first subpixel 2001 can emit light of a first color, the second subpixel 2002 can emit light of a second color, and the third subpixel 2003 can emit light of a third color.

In an embodiment, an area of the first subpixel 2001 is different from an area of the second subpixel 2002 and also different from an area of the third subpixel 2003. For example, in an embodiment of the present disclosure, the area of the first subpixel 2001 can be greater than the area of the second subpixel 2002 and the area of the third subpixel 2003. In an embodiment of the present disclosure, the first subpixel can be a blue subpixel emitting blue light, the second subpixel can be a red subpixel emitting red light, and the third subpixel can be a green subpixel emitting green light. When the display panel is an organic light emitting display panel, a blue light emitting material has a relatively short service life and a relatively low light emitting efficiency. In an embodiment of the present disclosure, relatively large area is set for the blue subpixel, so that light emitting effects of subpixels of different colors can be balanced.

In an embodiment of the present disclosure, a length $w_1$ of the first subpixel 2001 along the first direction a1 is smaller than a length $h_1$ of the first subpixel 2001 along the second direction a2 and is smaller than a length $w_2$ of the second subpixel 2002 along the first direction a1, and the length $h_1$ of the first subpixel 2001 along the second direction a2 is greater than a length $h_2$ of the second subpixel 2002 along the second direction a2.

For example, as shown in FIG. 3, a first gap G1 is formed between two adjacent first subpixels 2001 in the first pixel column 201, and the first subpixel 2001, closest to the first gap G1, in the third pixel column 203 at least partially overlaps the first gap G1 in the first direction a1.

In an embodiment, as shown in FIG. 3, in the first pixel column 201, for three adjacent first subpixels 2001, there is a first distance $L_1$ between the first subpixel 2001 located in the middle and the first subpixel 2001 located at a side of the first subpixel 2001 located in the middle, and a second distance $L_2$ is formed between the first subpixel 2001 located in the middle and the first subpixel 2001 located at the other side of the first subpixel 2001 located in the middle, and the first distance $L_1$ is smaller than the second distance $L_2$. In this way, when the display panel is an organic light emitting display panel, light emitting layers of two first subpixels 2001 with a spacing of the first distance $L_1$ can be formed by evaporation through an opening of a same mask.

The above subpixel arrangement manner can be referred to as a π-type pixel arrangement. In the π-type pixel arrangement, three closest subpixels of different colors constitute a pixel unit (as shown in FIG. 3, two pixel units 60 are indicated by a dotted-line border).

In this embodiment of the present disclosure, for the display panel based on the pixel arrangement rule shown in FIG. 3, when a position of the bridge 31 is set, as shown in FIG. 2, the bridges 31 include a first bridge 311, and an orthographic projection of the first bridge 311 on the plane of the substrate 1 is between orthographic projections of two adjacent pixel columns 20 on the plane of the substrate along the first direction a1, in other words, the orthographic projection of the first bridge 311 on the plane of the substrate 1 does not overlap any subpixel. With such configuration, visibility of the first bridge 311 can be minimized, and the display effect of the display panel can be improved.

Figure 8:
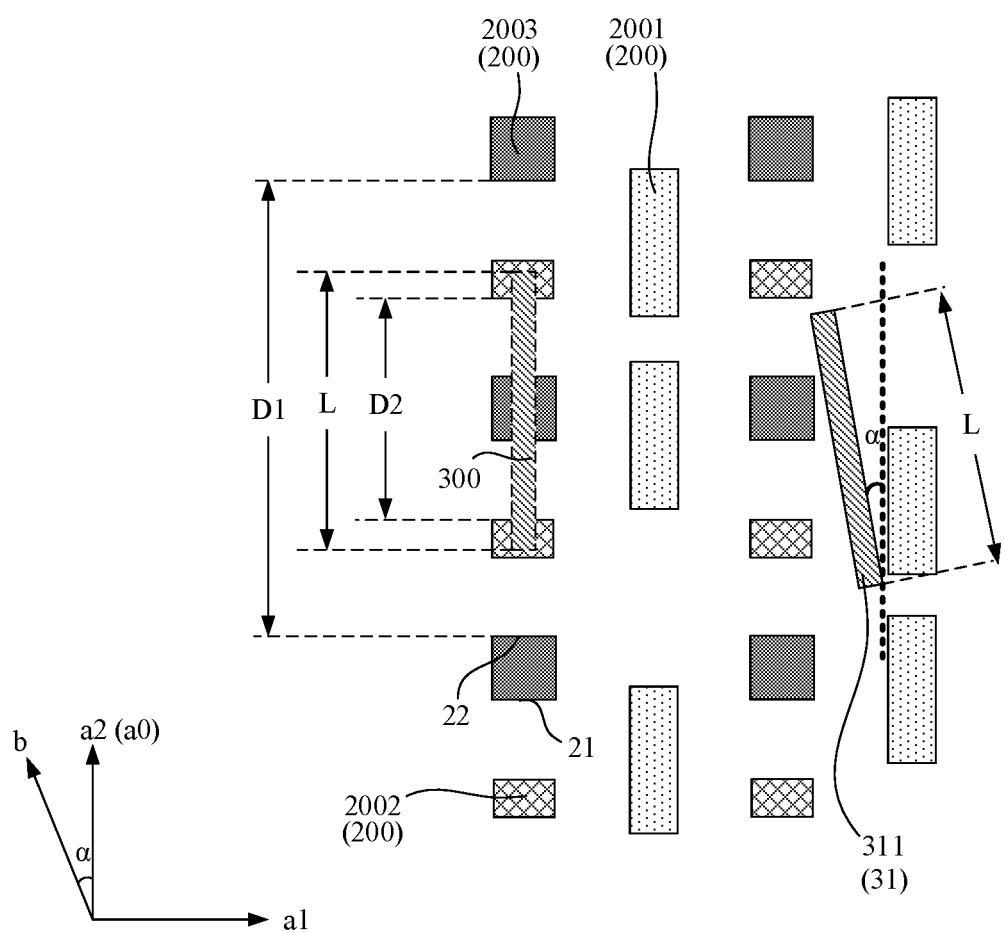
FIG. 8 is a schematic view of comparing relative position relationships between a subpixel satisfying an arrangement rule shown in FIG. 3 and two types of different bridges according to an embodiment of the present disclosure.

FIG. 8 is a schematic view of comparing relative position relationships between a subpixel satisfying the arrangement rule shown in FIG. 3 and two types of different bridges. To make a distinction, in FIG. 8, the contrast bridge 300 extending along the preset direction a0 is indicated by a dotted-line border, and the first bridge 311 provided in this embodiment of the present disclosure is indicated by a solid-line border. Lengths of the contrast bridge 300 and the first bridge 311 are L. In FIG. 8, for example, the preset direction a0 is parallel to the second direction a2, and N=5. For example, the length L of the first bridge 311, a distance D1 between the second edge 22 of a $1^{st}$ subpixel 200 and the first edge 21 of a $5^{th}$ subpixel 200 in the five subpixels 200 sequentially arranged along the preset direction a0, and a distance D2 between the second edge 22 of a $2^{nd}$ subpixel 200 and the first edge 21 of a $4^{th}$ subpixel 200 in the five subpixels 200 sequentially arranged along the preset direction a0 satisfy the following condition: D2≤L≤D1. In an embodiment of the present disclosure, it can be learned by comparing the first bridge 311 and the contrast bridge 300 that M=0 can be realized by disposing the first bridge 311 between two adjacent pixel columns 20 along the first direction a1, so as to minimize the quantity of subpixels overlapping the first bridge 311 and reduce the visibility of the first bridge 311.

Figure 9:
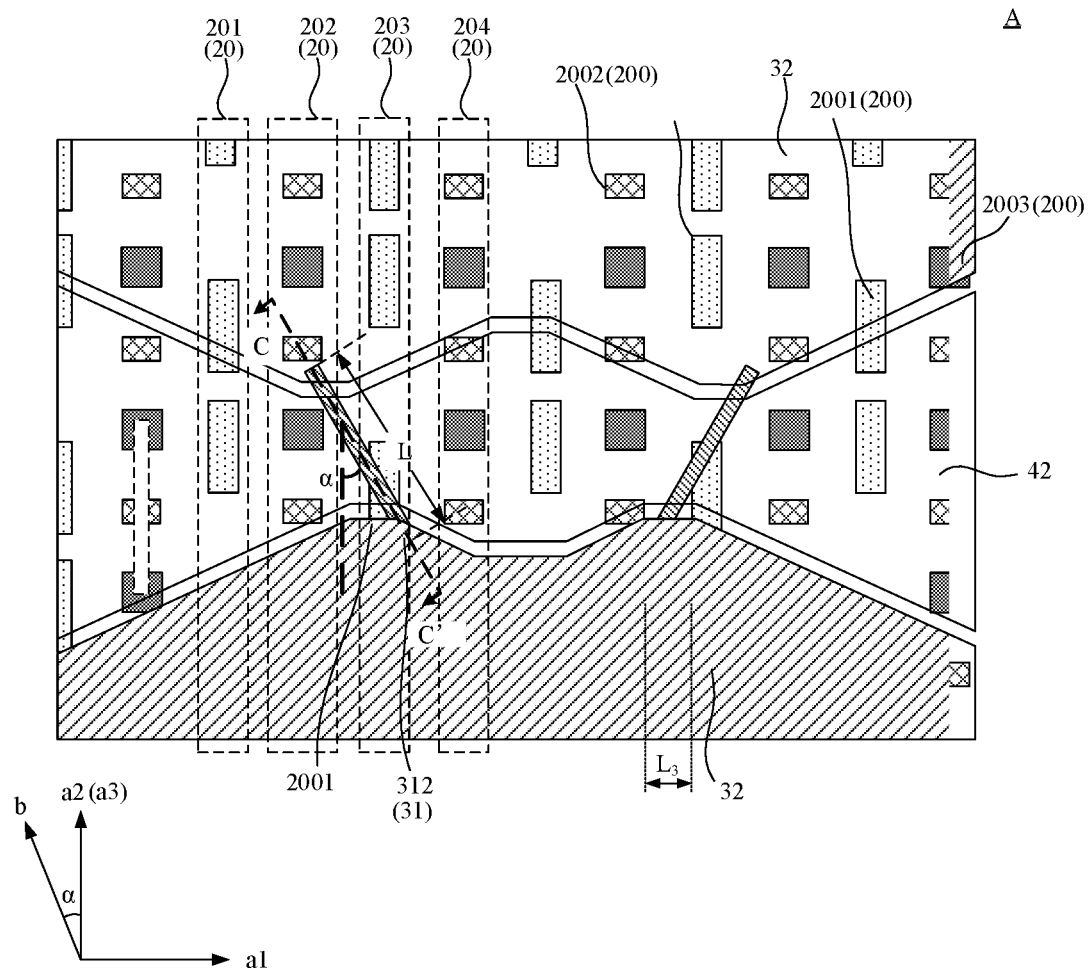
FIG. 9 is another enlarged schematic view of a region A in FIG. 1 according to an embodiment of the present disclosure.
Figure 10:
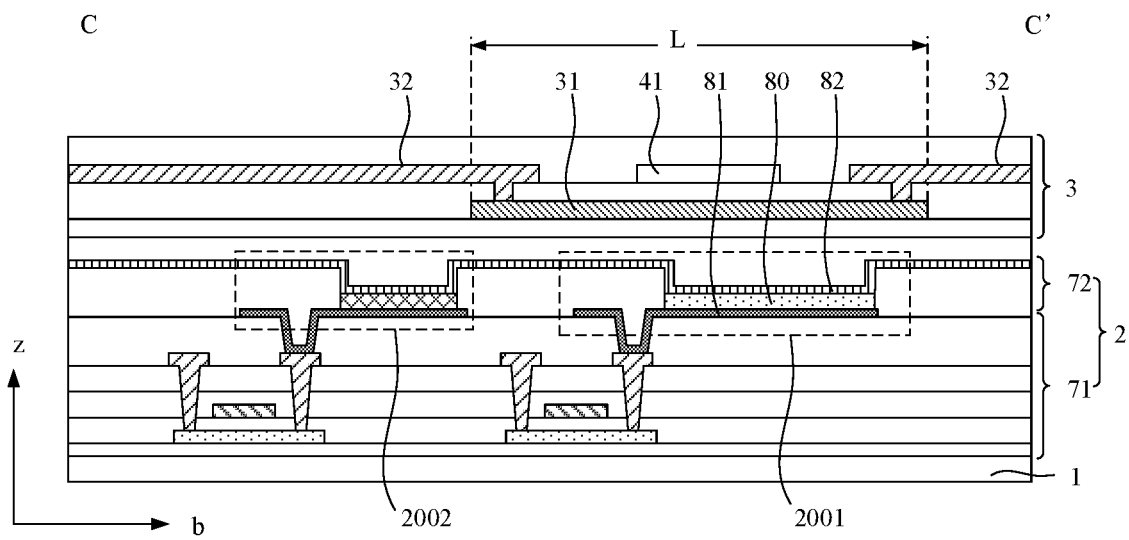
FIG. 10 is a schematic cross-sectional view of FIG. 9 along CC' according to an embodiment of the present disclosure.

FIG. 9 is another enlarged schematic view of a region A in FIG. 1, and FIG. 10 is a schematic cross-sectional view of FIG. 9 along CC'. In an embodiment, as shown in FIG. 9 and FIG. 10, the bridges 31 include a second bridge 312, an orthographic projection of the second bridge 312 on the plane of the substrate 1 overlaps one subpixel.

Figure 11:
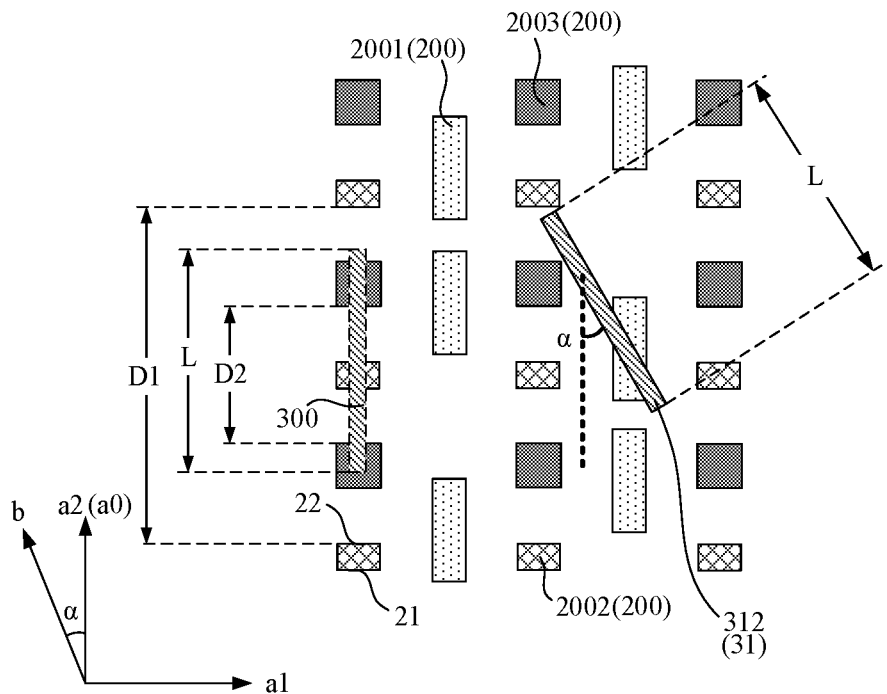
FIG. 11 is another schematic view of comparing relative position relationships between a subpixel satisfying an arrangement rule shown in FIG. 3 and two types of different bridges according to an embodiment of the present disclosure.

FIG. 11 is a schematic view of comparing relative position relationships between a subpixel satisfying the arrangement rule shown in FIG. 3 and two types of different bridges. To illustrate a distinction, in FIG. 11, the contrast bridge 300 extending along the preset direction a0 is indicated by a dotted-line border, and the second bridge 312 provided in this embodiment of the present disclosure is indicated by a solid-line border. Lengths of the contrast bridge 300 and the second bridge 312 are L. In FIG. 11, for example, the preset direction a0 is parallel to the second direction a2, and N=5. For example, the length L of the first bridge 311, a distance D1 between the second edge 22 of a $1^{st}$ subpixel 200 and the first edge 21 of a $5^{th}$ subpixel 200 in the five subpixels 200 sequentially arranged along the preset direction a0, and a distance D2 between the second edge 22 of a $2^{nd}$ subpixel 200 and the first edge 21 of a $4^{th}$ subpixel 200 in the five subpixels 200 sequentially arranged along the preset direction a0 satisfy the following condition: D2≤L≤D1. In this embodiment of the present disclosure, it can be learned by comparing the second bridge 312 and the contrast bridge 300 that the second bridge 312 can overlap only a few subpixels by setting the orthographic projection of the second bridge 312 on the plane of the substrate 1 to overlap one subpixel, in other words, setting M=1.

In this way, when the length L of the second bridge 312 is determined, as shown in FIG. 9, on the basis of given alignment precision of the display layer and the touch layer, a distance $L_3$ between two adjacent pixel columns 20 along the first direction a1 can be set to a small value in this embodiment of the present disclosure, to improve a resolution of the display panel. The distance $L_3$ between the two adjacent pixel columns 20 along the first direction a1 is a shortest distance between edges of two subpixels 200 that respectively belong to the two adjacent pixel columns 20.

For example, as shown in FIG. 9 and FIG. 10, the orthographic projection of the second bridge 312 on the plane of the substrate 1 at least partially overlaps an orthographic projection of the first subpixel 2001 on the plane of the substrate 1. In an embodiment, the first subpixel 2001 is a blue subpixel. When a white screen is synthesized, the blue subpixel has a lowest brightness among the subpixels emitting the red, green, and blue light. In an embodiment of the present disclosure, the orthographic projection of the second bridge 312 on the plane of the substrate is set to overlap an orthographic projection of the blue subpixel with lower brightness on the plane of the substrate 1. Compared with other red subpixels and green subpixels with higher brightness, a brightness change of the blue subpixel 2001 after the blue subpixel 2001 is shaded by the second bridge 312 is more difficult to be detected by the human eye, which reduces visibility of the second bridge 312.

Figure 12:
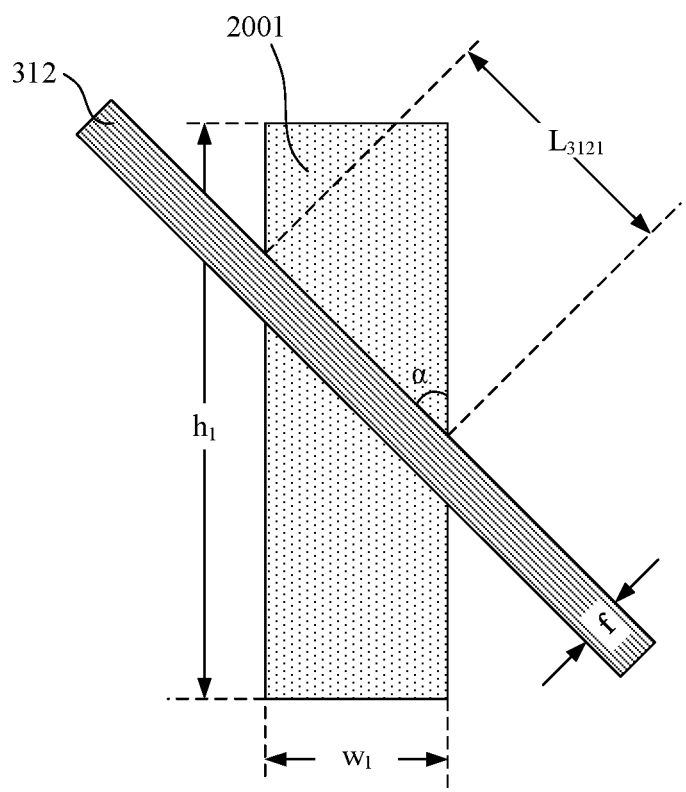
FIG. 12 is a schematic view of overlapping between a second bridge and a first subpixel according to an embodiment of the present disclosure.

FIG. 12 is a schematic view of overlapping between a second bridge and a first subpixel. In an embodiment, as shown in FIG. 12, when the orthographic projection of the second bridge 312 on the plane of the substrate 1 overlaps the orthographic projection of the first subpixel 2001 on the plane of the substrate 1, the second bridge 312 overlap a long side of the first subpixel 2001, so that area, shaded by the second bridge 312, of the first subpixel 2001 accounts for a small proportion of the total area of the first subpixel 2001, to reduce the visibility of the second bridge 312.

In an embodiment of the present disclosure, a width of the second bridge 312 is f, and f can be set to satisfy the following condition: $f/(h_1 \sin \alpha) < 20\%$. When the orthographic projection of the second bridge 312 on the plane of the substrate overlaps the first subpixel 2001, as shown in FIG. 12, the overlapping area $S_{3121}$ of the second bridge 312 and the first subpixel 2001 can satisfy the following condition:

$$S_{3121} = (f/\sin \alpha) \times w_1 \quad (1).$$

The area $S_{2001}$ of the first subpixel can satisfy the following condition:

$$S_{2001} = h_1 w_1 \quad (2).$$

In this embodiment of the present disclosure, with the condition of $f/(h_1 \sin \alpha) < 20\%$, it can be calculated that the proportion $S_{3121}/S_{2001}$ of the overlapping area $S_{3121}$ to the area $S_{2001}$ of the first subpixel satisfies the following condition: $S_{3121}/S_{2001} < 20\%$. In this way, the visibility of the second bridge 312 can be reduced. In a process of designing the display panel, the above angle α can be set accordingly.

For example, the length $w_1$, along the first direction a1, of the first subpixel 2001 and an acute angle α between an extending direction b of the second bridge 312 and the second direction a2 satisfy the following condition: $w_1/\sin \alpha < 29$ μm.

When the human eye observes an object at a position with a certain distance from the object, if an angle between a line connecting one endpoint of the object to the human eye and an angle between a line connecting another endpoint of the object to the human eye are smaller than 1 minute of arc, the object and a background will be blended together and cannot be recognized by the human eye. 1 minute of arc=(1/60) degree=[(2π/360)/60]radian=0.00029 radian. For example, a distance between the human eye and a display screen is 10 cm, a minimum distance between points, on the screen, that can be seen by the human eyes at a position with a distance of 10 cm from the screen is about equal to an arc length, and arc length=radian×radius=0.00029×10 cm=0.0029 cm=29 μm. When the orthographic projection of the second bridge 312 on the plane of the substrate 1 overlaps the orthographic projection of the first subpixel 2001 on the plane of the substrate 1, as shown in FIG. 12, a length $L_{3121}$, shaded by the second bridge 312, of the first subpixel 2001 satisfies the following condition: $L_{3121} = w_1/\sin \alpha$. In an embodiment of the present disclosure, $w_1/\sin \alpha < 29$ μm, which can make the length, shaded by the second bridge 312, of the first subpixel 2001 smaller than a distinguishable length for the human eyes, and can make the second bridge 312 almost invisible.

In an embodiment of the present disclosure, the second bridge 312 and the first bridge 311 can belong to a same bridge group. In other words, the first bridge 311 and the second bridge 312 are connected in parallel to two adjacent first touch electrodes 32. In another embodiment, the first bridge 311 and the second bridge 312 can belong to different bridge groups. This is not limited in this embodiment of the present disclosure.

Figure 13:
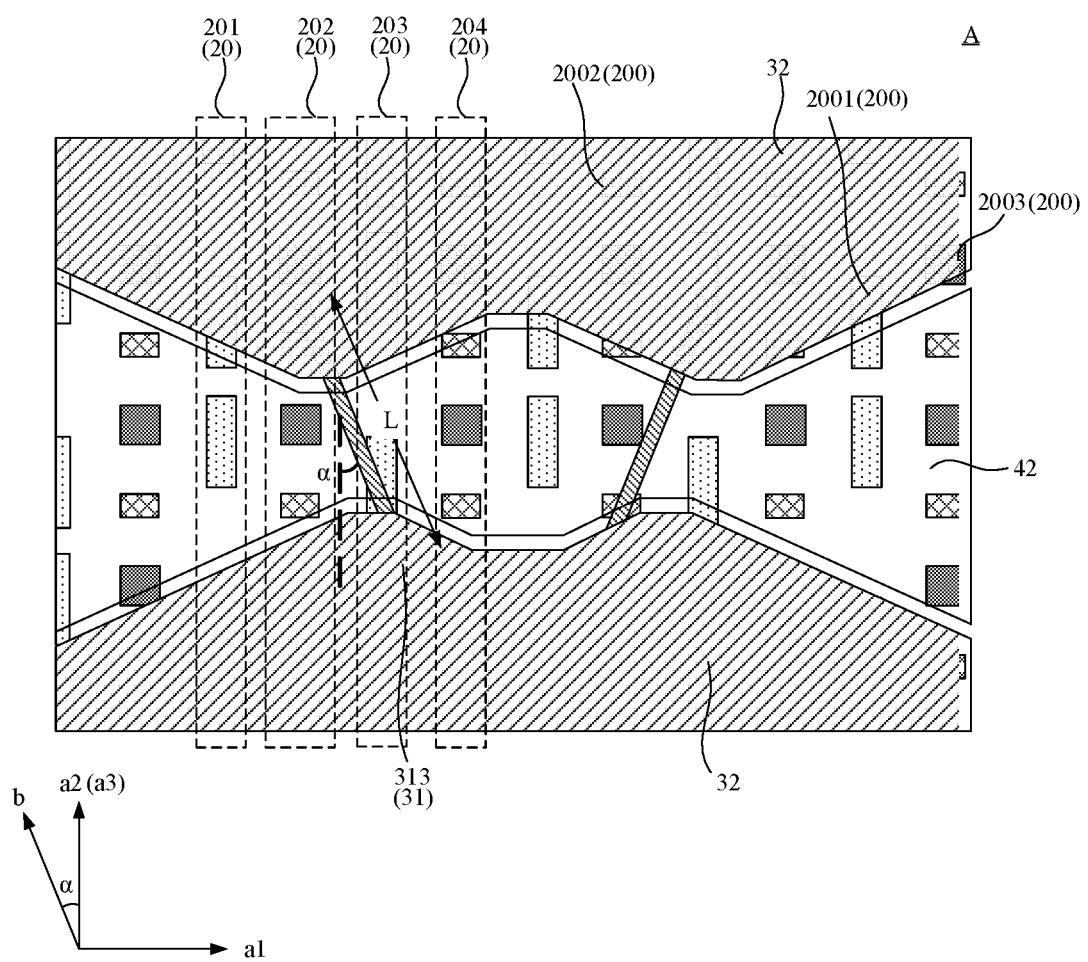
FIG. 13 is still another enlarged schematic view of a region A in FIG. 1 according to an embodiment of the present disclosure.

FIG. 13 is still another enlarged schematic view of a region A in FIG. 1. In an embodiment, as shown in FIG. 13, the bridges further include a third bridge 313, an orthographic projection, of the third bridge 313, on the plane of the substrate 1 at least partially overlaps the orthographic projection of the first subpixel 2001 on the plane of the substrate 1 and an orthographic projection of the second subpixel 2002 on the plane of the substrate 1. In addition, the first subpixel 2001 and the second subpixel 2002 that overlap a same third bridge 313 are located in different pixel columns 20.

Figure 14:
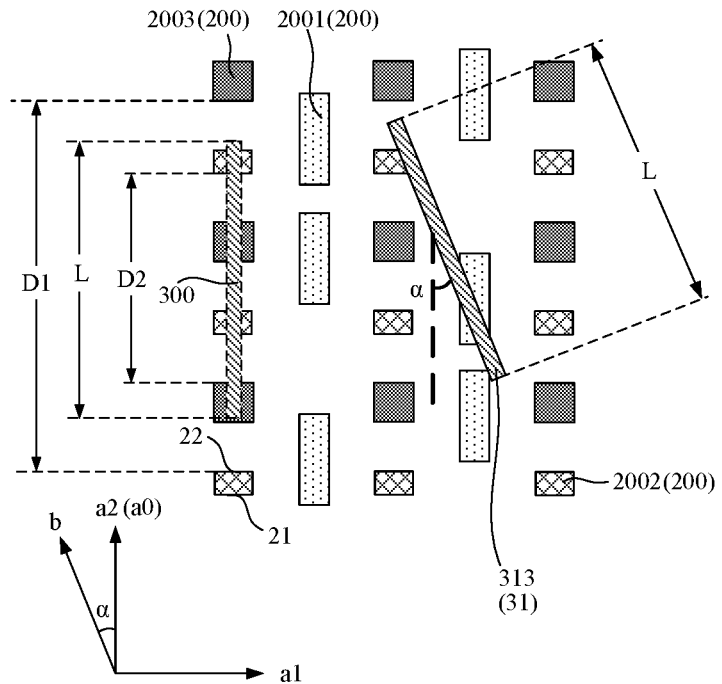
FIG. 14 is still another schematic view of comparing relative position relationships between a subpixel satisfying an arrangement rule shown in FIG. 3 and two types of different bridges according to an embodiment of the present disclosure.

FIG. 14 is another schematic view of comparing relative position relationships between a subpixel satisfying the arrangement rule shown in FIG. 3 and two types of different bridges. To make a distinction, in FIG. 14, the contrast bridge 300 extending along the preset direction a0 is indicated by a dotted-line border, and the third bridge 313 provided in this embodiment of the present disclosure is indicated by a solid-line border. Lengths of the contrast bridge 300 and the third bridge 313 are L. In an embodiment, as shown in FIG. 14, the preset direction a0 is parallel to the second direction a2, and N=6. In other words, the length L of the third bridge 313, a distance D1 between the second edge 22 of a 1$^{st}$ subpixel 200 and the first edge 21 of a 6$^{th}$ subpixel 200 in the six subpixels 200 sequentially arranged along the preset direction a0, and a distance D2 between the second edge 22 of a 2$^{nd}$ subpixel 200 and the first edge 21 of a 5$^{th}$ subpixel 200 in the six subpixels 200 sequentially arranged along the preset direction a0 satisfy the following condition: D2≤L≤D1. In the embodiment of the present disclosure, it can be learned by comparing the third bridge 313 and the contrast bridge 300 that the third bridge 313 can overlap only a few subpixels by setting the orthographic projection of the third bridge 313 on the plane of the substrate 1 to at least partially overlap the orthographic projection of the first subpixel 2001 on the plane of the substrate 1 and the orthographic projection of the second subpixel 2002 on the plane of the substrate 1, in other words, M=2.

In this way, the length of the third bridge 313 becomes longer to connect two first touch electrodes 32 with a large spacing, thereby improving practicability of this embodiment of the present disclosure. In addition, the third bridge 313 can be kept away from the blue subpixel 2003 with largest brightness, thereby ensuring that the third bridge 313 still has a relatively low visibility, and improving the display effect of display panel. When the length of the third bridge 313 is determined, the configuration provided by this embodiment of the present disclosure can be used to increase the angle α between the third bridge 313 and the second direction a2, and enable the third bridge 313 to overlap the long side of the first subpixel 2001 to avoid overlapping a short side of the first subpixel 2001, which can reduce a proportion of area, shaded by the third bridge 313, of the first subpixel 2001 to the total area of the first subpixel 2001.

Figure 15:
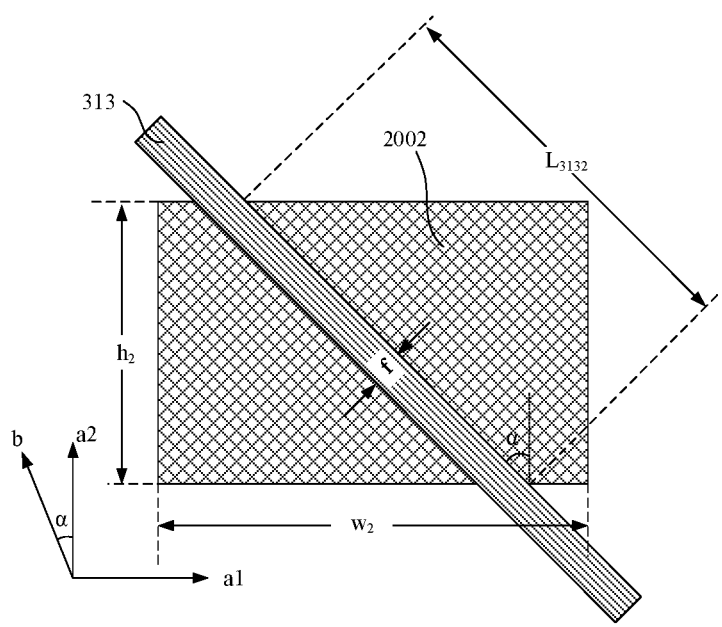
FIG. 15 is a schematic view of overlapping between a third bridge and a second subpixel according to an embodiment of the present disclosure.

FIG. 15 is a schematic view of overlapping between a third bridge and a second subpixel. In an embodiment, as shown in FIG. 15, when the orthographic projection of the third bridge 313 on the plane of the substrate 1 overlaps the second subpixel 2002, the orthographic projection of the third bridge 313 on the plane of the substrate 1, overlaps a long side of the second subpixel 2002, so that area, shaded by the third bridge 313, of the second subpixel 2002 accounts for a small proportion of the total area of the second subpixel 2002, and the visibility of the third bridge 313 is reduced.

In an embodiment of the present disclosure, a width of the third bridge 313 is f, when the orthographic projection of the third bridge 313 on the plane of the substrate 1 overlaps the first subpixel 2001 and the second subpixel 2002, similar to the description about the second bridge 312 shown in FIG. 11, $f/(h_1 \sin \alpha) < 20\%$, so that the proportion of the area, shaded by the third bridge 313, of the first subpixel 2001 to the total area of the first subpixel 2001 can be reduced. $f/(w_2 \cos \alpha) < 20\%$ can decrease the proportion of the area, shaded by the third bridge 313, of the second subpixel 2002 to the total area of the second subpixel 2002, thereby reducing the visibility of the third bridge 313.

As shown in FIG. 15, the overlapping area $S_{3132}$ of the third bridge 313 and the second subpixel 2002 can satisfy the following condition:

$$S_{3132} = (f/\cos \alpha) \times h_2 \quad (1).$$

The area $S_{2002}$ of the second subpixel can satisfy the following condition:

$$S_{2002} = w_2 h_2 \quad (2).$$

In the embodiment of the present disclosure, with the configuration $f/(w_2 \cos \alpha) < 20\%$, it can be calculated that the proportion $S_{3132}/S_{2002}$ of the overlapping area $S_{3132}$ to the area $S_{2002}$ of the second subpixel can satisfy the following condition: $S_{3132}/S_{2002} < 20\%$. In this way, the proportion of the area, shaded by the third bridge 313, of the second subpixel 2002 to the total area of the second subpixel 2002 can be reduced, thereby reducing the visibility of the third bridge 313.

For example, in an embodiment of the present disclosure, $f/(h_1 \sin \alpha) - f/(w_2 \cos \alpha) < 0.1\%$, so that the proportion of the area, shaded by the third bridge 313, of the first subpixel 2001 is approximately equal to the proportion of the area, shaded by the third bridge 313, of the second subpixel 2002. In this way, a degree that light emitting of the first subpixel 2001 is affected by the third bridge 313 is substantially the same as a degree that light emitting of the second subpixel 2002 is affected by the third bridge 313.

For example, the length, along the second direction a2, of the second subpixel 2002 is $h_2$. In an embodiment of the present disclosure, $h_2/\cos \alpha < 29$ μm. As shown in FIG. 15, a length $L_{3132}$, shaded by the third bridge 313, of the second subpixel 2002 satisfies the following condition: $L_{3132} = h_2/\cos \alpha$. In the embodiment of the present disclosure, $h_2/\cos \alpha < 29$ μm, which can make the length, shaded by the third bridge 313, of the second subpixel 2002 smaller than the distinguishable length of the human eye, and can make the third bridge 313 almost invisible.

Figure 16:
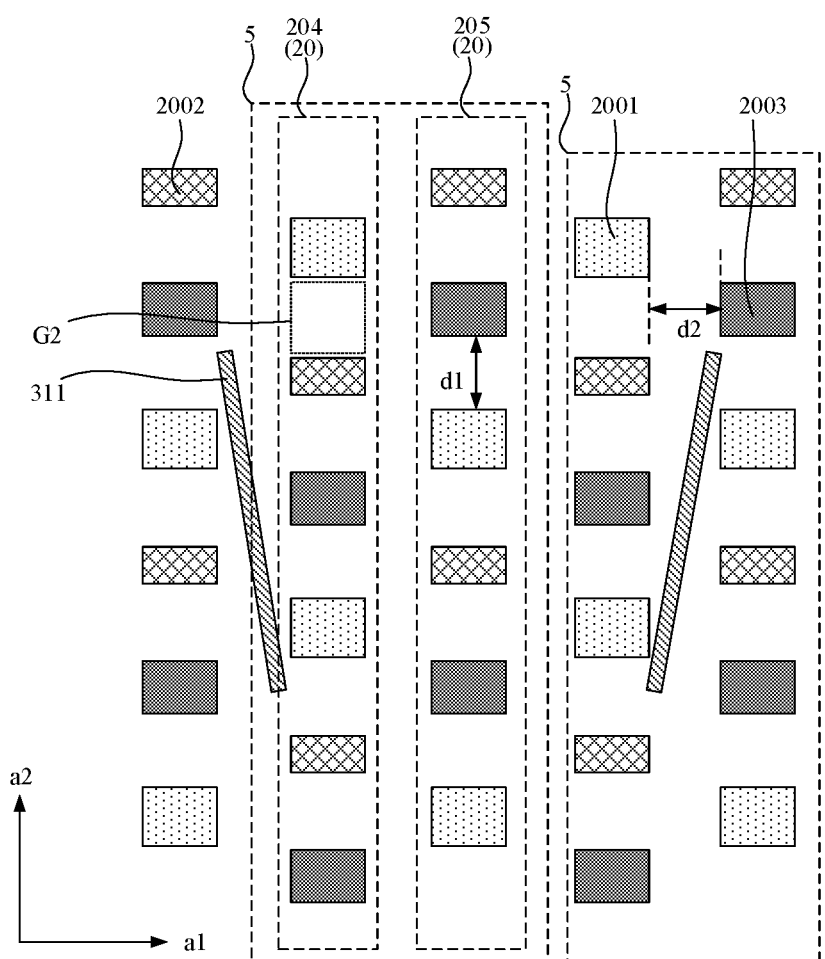
FIG. 16 is still another enlarged schematic view of a region A in FIG. 1 according to an embodiment of the present disclosure.

FIG. 16 is still another enlarged schematic diagram of a region A in FIG. 1. In order to make the figure clearer, FIG. 16 only shows the pixel column and the bridge, and does not show the first touch electrode or the second touch electrode. In an embodiment, as shown in FIG. 16, the pixel columns 20 include a fourth pixel column 204 and a fifth pixel column 205 that are alternately arranged along the first direction a1. The fourth pixel column 204 and the fifth pixel column 205 each includes a first subpixel 2001, a second subpixel 2002, and a third subpixel 2003 that are sequentially arranged along the second direction a2. In a same pixel column, a shortest distance between the first subpixel 2001 and the adjacent third subpixel 2003 along the second direction a2 is $d_1$, and a shortest distance between the fourth pixel column 204 and the adjacent fifth pixel column 205 is dz. A second gap G2 is formed between two adjacent subpixels in the fourth pixel column 204, and a subpixel, closest to the second gap G2, in the fifth pixel column 205 at least partially overlaps the second gap G2 in the first direction a1. The fourth pixel column 204 and the fifth pixel column 205 constitute a minimum pixel repeating unit column group 5. Minimum pixel repeating unit column groups 5 are sequentially arranged along the first direction a1.

In an embodiment of the present disclosure, for the display panel based on the pixel arrangement rule shown in FIG. 16, when a position of the bridge is set, a first bridge 311 can be disposed in the bridges, and an orthographic projection of the first bridge 311 on the plane of the substrate 1 is between orthographic projections of two adjacent pixel columns 20 on the plane of the substrate along the first direction a1, in other words, the orthographic projection of the first bridge 311 on the plane of the substrate 1 does not overlap any subpixel, which can minimize visibility of the first bridge 311 and improve the display effect of the display panel.

Figure 17:
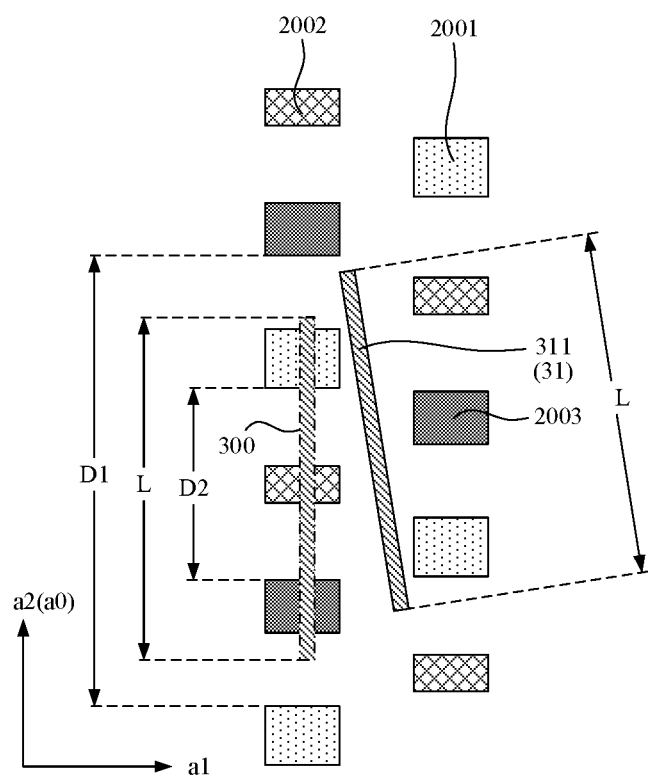
FIG. 17 is a schematic view of comparing relative position relationships between a subpixel satisfying an arrangement rule shown in FIG. 16 and two types of different bridges according to an embodiment of the present disclosure.

FIG. 17 is a schematic view of comparing relative position relationships between a subpixel satisfying the arrangement rule shown in FIG. 16 and two types of different bridges. To make a distinction, in FIG. 17, the contrast bridge 300 extending along the preset direction a0 is indicated by a dotted-line border, and the first bridge 311 provided in this embodiment of the present disclosure is indicated by a solid-line border. Lengths of the contrast bridge 300 and the first bridge 311 are L. In an embodiment, as shown in FIG. 17, the preset direction a0 is parallel to the second direction a2, and N=5. The length L of the first bridge 311, a distance D1 between the second edge 22 of a $1^{st}$ subpixel 200 and the first edge 21 of a $5^{th}$ subpixel 200 in the five subpixels 200 sequentially arranged along the preset direction a0, and a distance D2 between the second edge 22 of a $2^{nd}$ subpixel 200 and the first edge 21 of a $4^{th}$ subpixel 200 in the five subpixels 200 sequentially arranged along the preset direction a0 satisfy the following condition:

D2≤L≤D1. In an embodiment of the present disclosure, it can be learned by comparing the first bridge 311 and the contrast bridge 300 that M=0 can be realized by disposing the first bridge 311 between two adjacent pixel columns 20 along the first direction a1, so as to minimize a quantity of subpixels overlapping the first bridge 311.

Figure 18:
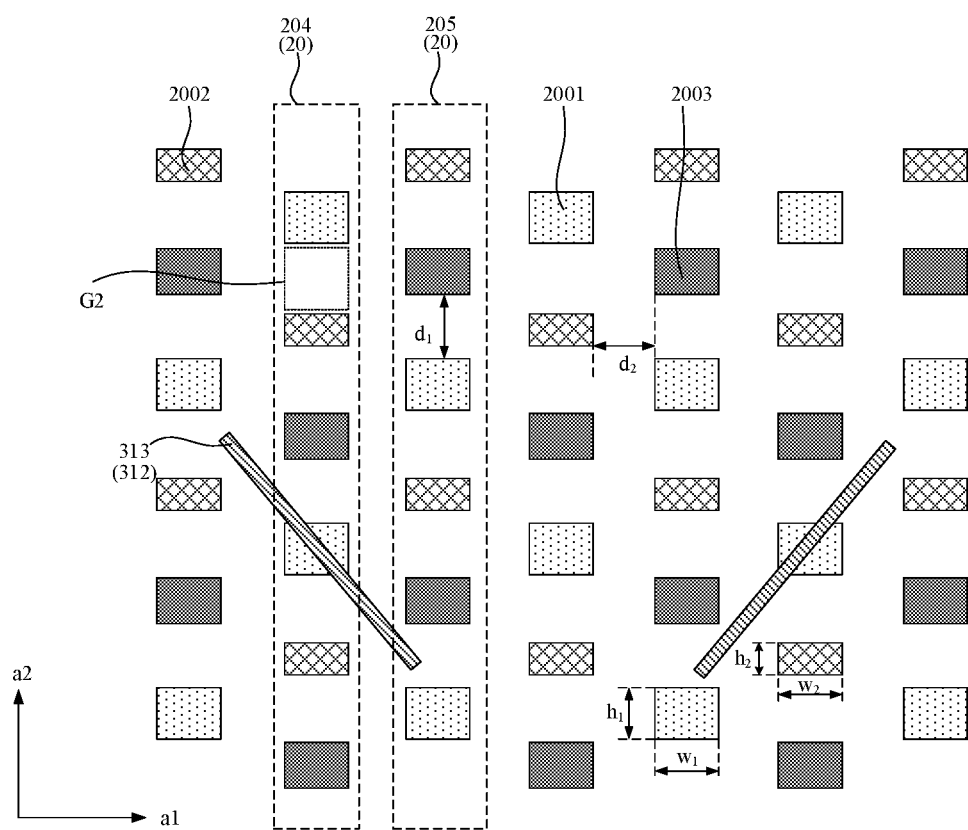
FIG. 18 is still another enlarged schematic view of a region A in FIG. 1 according to an embodiment of the present disclosure.

FIG. 18 is still another enlarged schematic view of a region A in FIG. 1. In order to make the figure clearer, FIG. 18 only shows the pixel column and the bridge, and does not show the first touch electrode or the second touch electrode. In an embodiment of the present disclosure, the bridges can further include a second bridge 312, and an orthographic projection of the second bridge 312 on the plane of the substrate 1 overlaps one subpixel.

Figure 19:
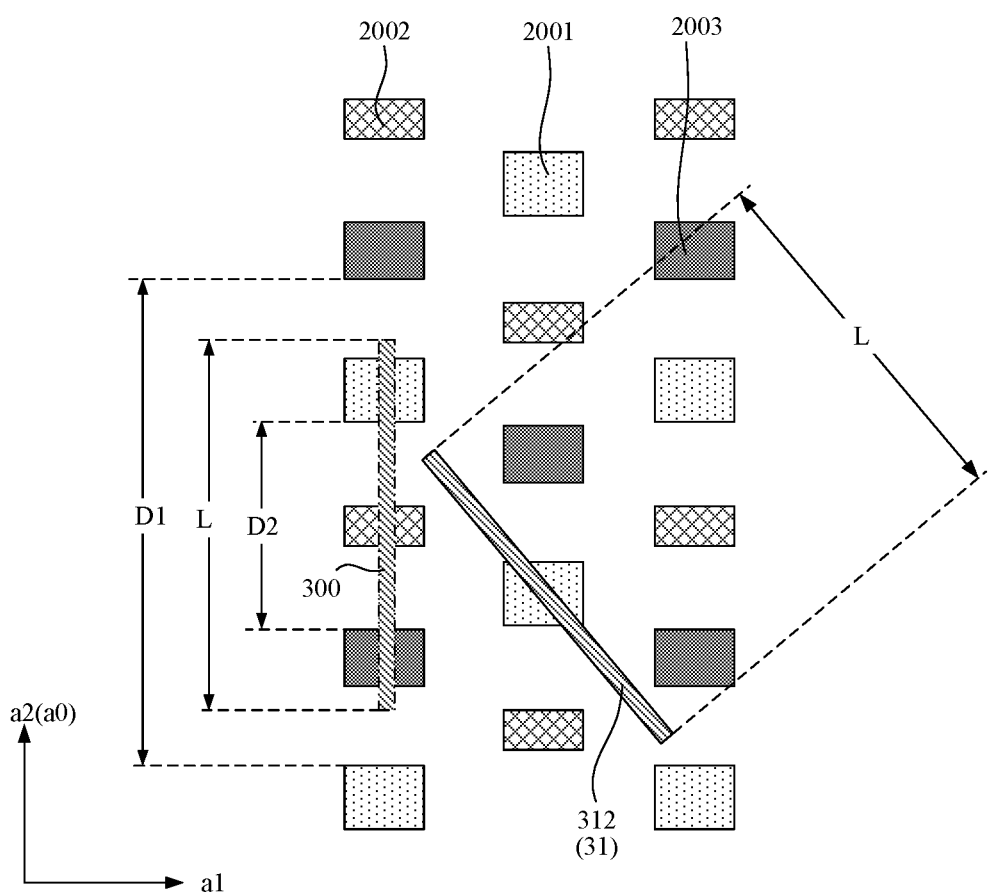
FIG. 19 is another schematic view of comparing relative position relationships between a subpixel satisfying an arrangement rule shown in FIG. 16 and two types of different bridges according to an embodiment of the present disclosure.

FIG. 19 is another schematic view of comparing relative position relationships between a subpixel satisfying the arrangement rule shown in FIG. 16 and two types of different bridges. To make a distinction, in FIG. 19, the contrast bridge 300 extending along the preset direction a0 is indicated by a dotted-line border, and the second bridge 312 provided in this embodiment of the present disclosure is indicated by a solid-line border. Lengths of the contrast bridge 300 and the second bridge 312 are L. In an embodiment, as shown in FIG. 19, for example, the preset direction a0 is parallel to the second direction a2, and N=5. The length L of the second bridge 312, a distance D1 between the second edge 22 of a $1^{st}$ subpixel 200 and the first edge 21 of a $5^{th}$ subpixel 200 in five subpixels 200 sequentially arranged along the preset direction a0, and a distance D2 between the second edge 22 of a $2^{nd}$ subpixel 200 and the first edge 21 of a $4^{th}$ subpixel 200 in the five subpixels 200 sequentially arranged along the preset direction a0 satisfy the following condition: D2≤L≤D1. In the embodiment of the present disclosure, it can be learned by comparing the second bridge 312 and the contrast bridge 300 that a quantity of subpixels overlapping the second bridge 312 can be reduced by setting an orthographic projection of the second bridge 312 on the plane of the substrate 1 to overlap one subpixel, in other words, M=1.

As shown in FIG. 18, when the length of the second bridge 312 is determined, a distance $d_2$ between two adjacent subpixel columns 20 along the first direction a1 in the display panel with such the pixel arrangement can be set to a small value, to improve a resolution of the display panel, the $d_2$ between the two adjacent pixel columns 20 along the first direction a1 can be a shortest distance between edges of two subpixels 200 that respectively belong to the two adjacent pixel columns 20.

For example, in an embodiment of the present disclosure, the second bridges 312 include a third bridge 313, and an orthographic projection of the third bridge 313 on the plane of the substrate 1 at least partially overlaps an orthographic projection of the first subpixel 2001 on the plane of the substrate 1. For example, the first subpixel 2001 is a blue subpixel. When a white screen is synthesized, the blue subpixel has lowest brightness. In this embodiment of the present disclosure, the orthographic projection of the third bridge 313 on the plane of the substrate is set to overlap an orthographic projection of the blue subpixel with lower brightness on the plane of the substrate. Compared with other red and green subpixels with higher brightness, impact of overlapping between the third bridge 313 and the blue subpixel on the brightness of the blue subpixel is more difficult to be detected by the human eye, and this makes for reducing visibility of the third bridge 313.

Figure 20:
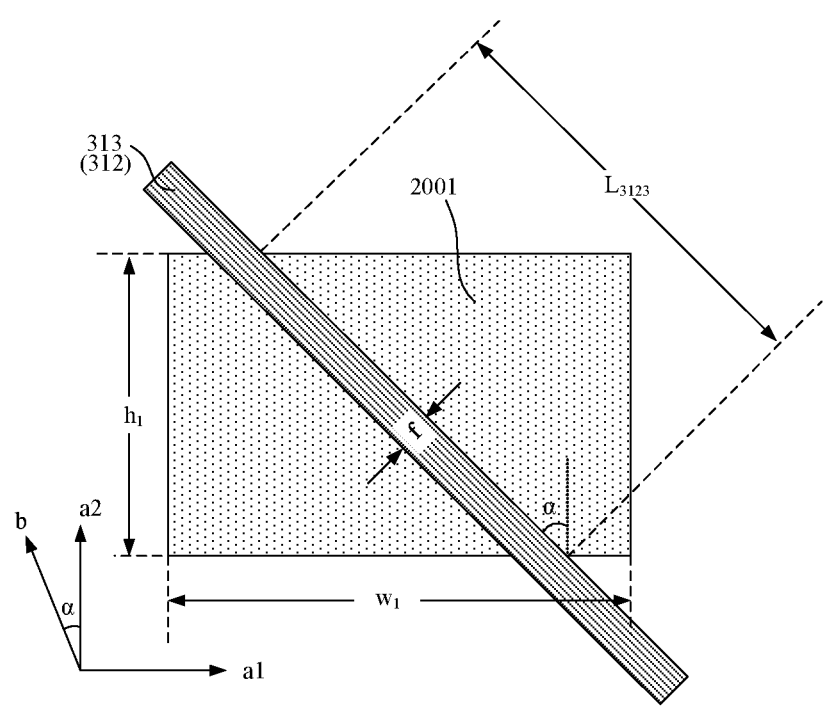
FIG. 20 is a schematic view of overlapping between a third bridge and a first subpixel according to an embodiment of the present disclosure.

FIG. 20 is a schematic view of overlapping between a third bridge and a first subpixel. In an embodiment, as shown in FIG. 18 and FIG. 20, a length $w_1$, along the first direction a1, of the first subpixel 2001 is greater than a length $h_1$, along the second direction a2, of the first subpixel 2001; and when the orthographic projection of the third bridge 313 on the plane of the substrate 1 overlaps the orthographic projection of the first subpixel 2001 on the plane of the substrate 1, the third bridge 313 is set to overlap a long side of the first subpixel 2001 in this embodiment of the present disclosure, so that area, shaded by the third bridge 313, of the first subpixel 2001 accounts for a small proportion of total area of the first subpixel 2001, thereby reducing the visibility of the third bridge 313.

As shown in FIG. 18 and FIG. 20, a width of the third bridge 313 is f, and the length, along the first direction a1, of the first subpixel 2001 is $w_1$. In an embodiment of the present disclosure, $f/(w_1 \cos \alpha) < 20\%$. When the orthographic projection of the third bridge 313 on the plane of the substrate 1 overlaps the first subpixel 2001, the overlapping area $S_{3123}$ of the third bridge 313 and the first subpixel 2001 can satisfy the following condition:

$$S_{3123} = (f/\cos \alpha) \times h_1 \quad (1).$$

The area $S_{2001}$ of the first subpixel 2001 can satisfy the following condition:

$$S_{2002} = w_1 h_1 \quad (2).$$

In the embodiment of the present disclosure, $f/(w_1 \cos \alpha) < 20\%$, it can be calculated that the proportion $S_{3123}/S_{2002}$ of the overlapping area $S_{3123}$ to the area $S_{2001}$ of the first subpixel 2001 can satisfy the following condition: $S_{3123}/S_{2002} < 20\%$. In this way, the proportion of the area, shaded by the third bridge 313, of the first subpixel 2001 to the total area of the first subpixel 2001 can be reduced, thereby reducing the visibility of the third bridge 313.

For example, the length, along the second direction a2, of the first subpixel 2001 is $h_1$. In an embodiment of the present disclosure, $h_1/\cos \alpha < 29$ μm. As shown in FIG. 20, a length $L_{3123}$, shaded by the second bridge 312, of the first subpixel 2001 can satisfy the following condition: $L_{3123} = h_2/\cos \alpha$. In an embodiment of the present disclosure, $h_2/\cos \alpha < 29$ μm, which can make the length, shaded by the third bridge 313, of the first subpixel 2001 smaller than a distinguishable length of the human eye, and can make the third bridge 313 almost invisible.

Figure 21:
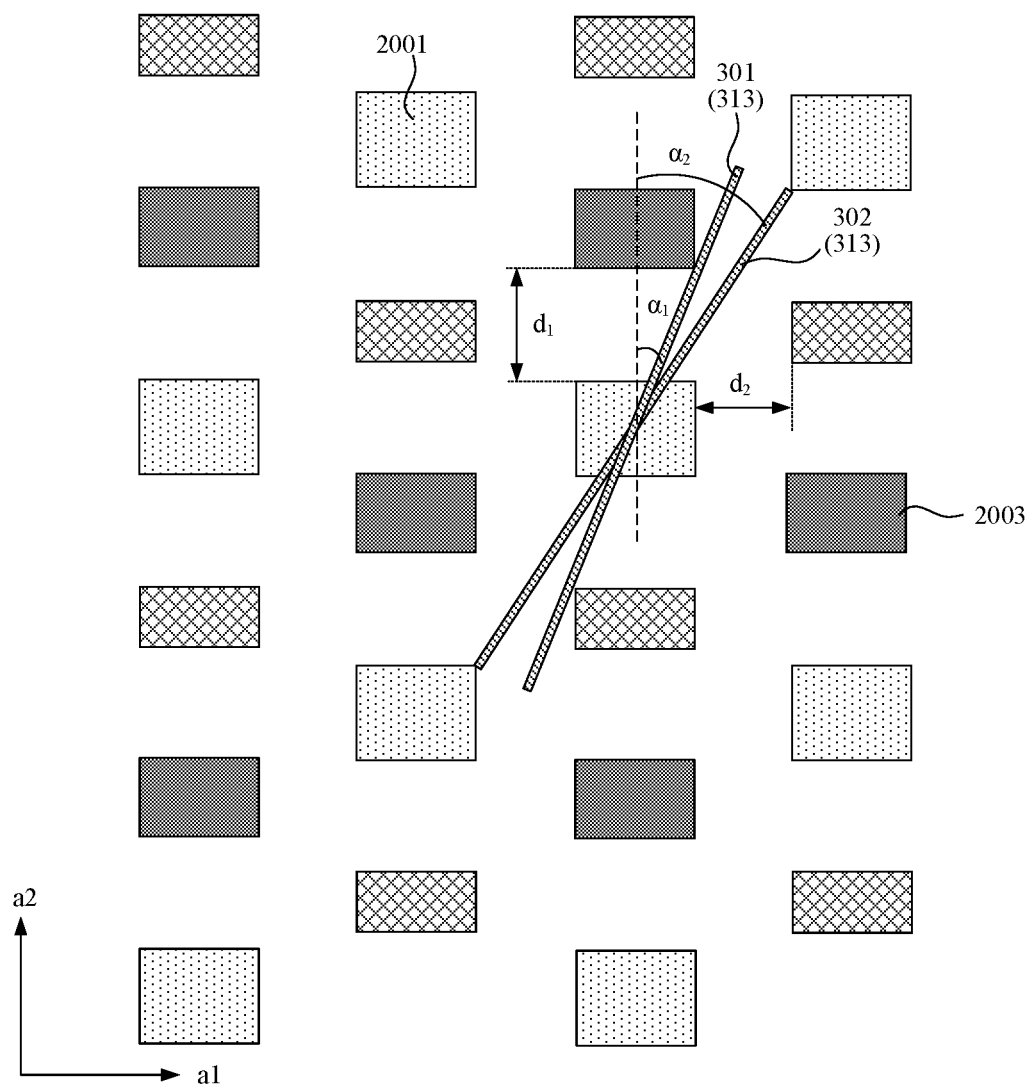
FIG. 21 is still another enlarged schematic view of a region A in FIG. 1 according to an embodiment of the present disclosure.

FIG. 21 is a still another enlarged schematic view of a region A in FIG. 1. For example, as shown in FIG. 21, a center of the orthographic projection of the third bridge 313 on the plane of the substrate 1 overlaps a center of the orthographic projection of the first subpixel 2001 on the plane of the substrate 1. In this way, when the display layer and the touch layer are aligned, if a length of the third bridge 313 is determined and the third bridge 313 does not overlap the third subpixel 2003 with relatively high brightness, an angle α between the third bridge 313 and the second direction a2 can be adjusted within a relatively large range, thereby improving process flexibility.

Figure 22:
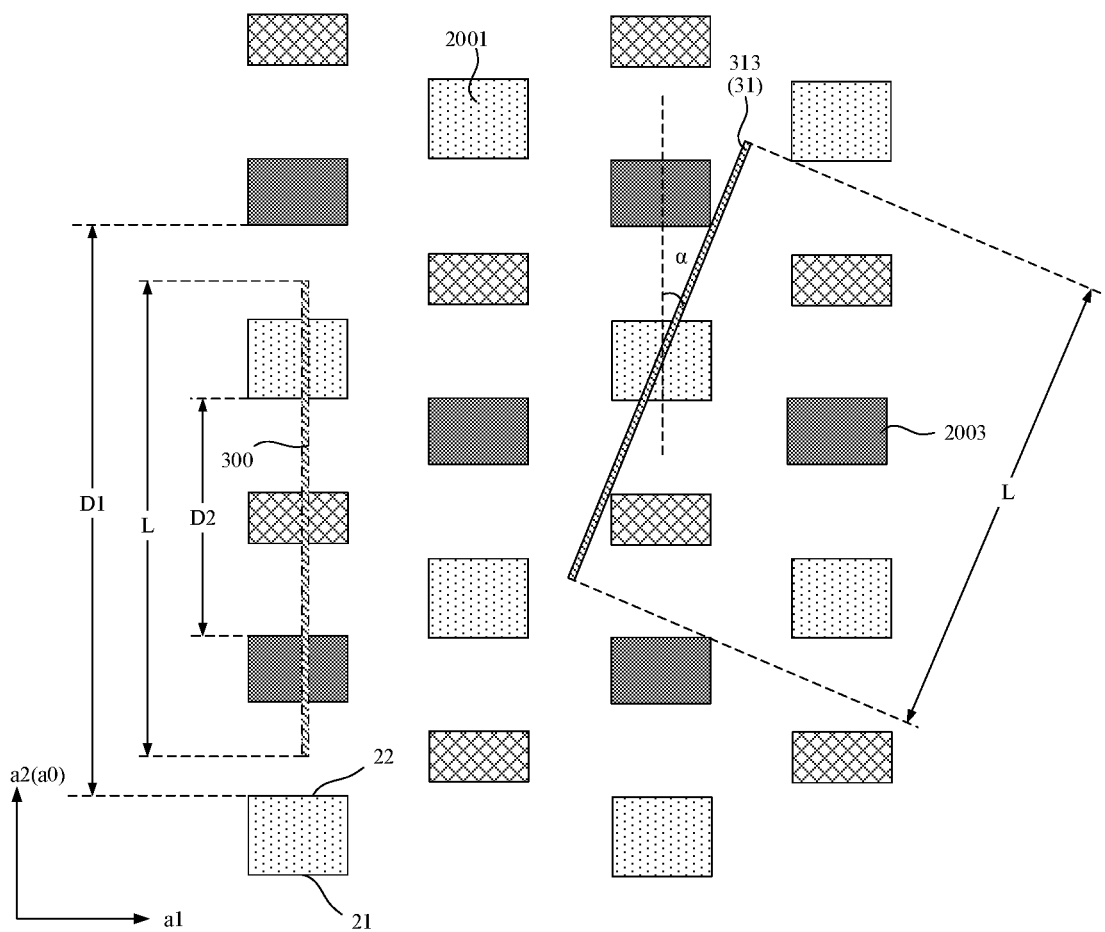
FIG. 22 is still another schematic view of comparing relative position relationships between a subpixel satisfying an arrangement rule shown in FIG. 16 and two types of different bridges according to an embodiment of the present disclosure.

FIG. 22 is still another schematic view of comparing relative position relationships between a subpixel satisfying the arrangement rule shown in FIG. 16 and two types of different bridges. To make a distinction, in FIG. 22, the contrast bridge 300 extending along the preset direction a0 is indicated by a dotted-line border, and the third bridge 313 provided in this embodiment of the present disclosure is indicated by a solid-line border. Lengths of the contrast bridge 300 and the third bridge 313 are L. For example, as shown in FIG. 22, the preset direction a0 is parallel to the second direction a2, and N=5. In the embodiment of the present disclosure, it can be learned by comparing the third bridge 313 and the contrast bridge 300 that a quantity of subpixels overlapping the third bridge 313 can be reduced by setting the orthographic projection of the third bridge 313 on the plane of the substrate 1 to overlap one subpixel, in other words, M=1.

In an embodiment of the present disclosure, referring to FIG. 21, the length, along the first direction a1, of the first subpixel 2001 is $w_1$, the length, along the second direction a2, of the first subpixel 2001 is $h_1$, and the angle α between the third bridge 313 and the second direction a2 satisfies the following condition: $\alpha_1 \leq \alpha \leq \alpha_2$, where $\alpha_1 = \arctan(w_1/(h_1+2d_1))$, and $\alpha_2 = \arcsin((w_1+2d_2)/L)$. In this way, the quantity of subpixels overlapping the second bridge 312 can be minimized.

When $\alpha = \alpha_1$, as shown in FIG. 21, the third bridge 313 is at a position indicated by 301. At the position 301, the third bridge 313 overlaps the first subpixel 2001, a center of the orthographic projection of the third bridge 313 on the plane of the substrate 1 overlaps the center of the orthographic projection of the first subpixel 2001 on the plane of the substrate 1, and one part of the third bridge 313 is infinitely close to the third subpixel 2003. In an embodiment of the present disclosure, the angle α between the third bridge 313 and the second direction a2 is set to be greater than or equal to $\alpha_1$, which can prevent the orthographic projection of the third bridge 313 on the plane of the substrate 1 from overlapping the third subpixel 2003.

When $\alpha = \alpha_2$, as shown in FIG. 21, the third bridge 313 is at a position indicated by 302. At the position 302, the third bridge 313 overlaps the first subpixel 2001, a center of the orthographic projection of the third bridge 313 on the plane of the substrate 1 overlaps the center of the orthographic projection of the first subpixel 2001 on the plane of the substrate 1, and one end portion of the third bridge 313 is infinitely close to another first subpixel 2001. In an embodiment of the present disclosure, the angle α between the third bridge 313 and the second direction a2 is set to be smaller than or equal to $\alpha_2$, which allows disposing a plurality of bridges with the tilt angle in the display panel and ensures that these bridges each overlap only one subpixel.

Figure 23:
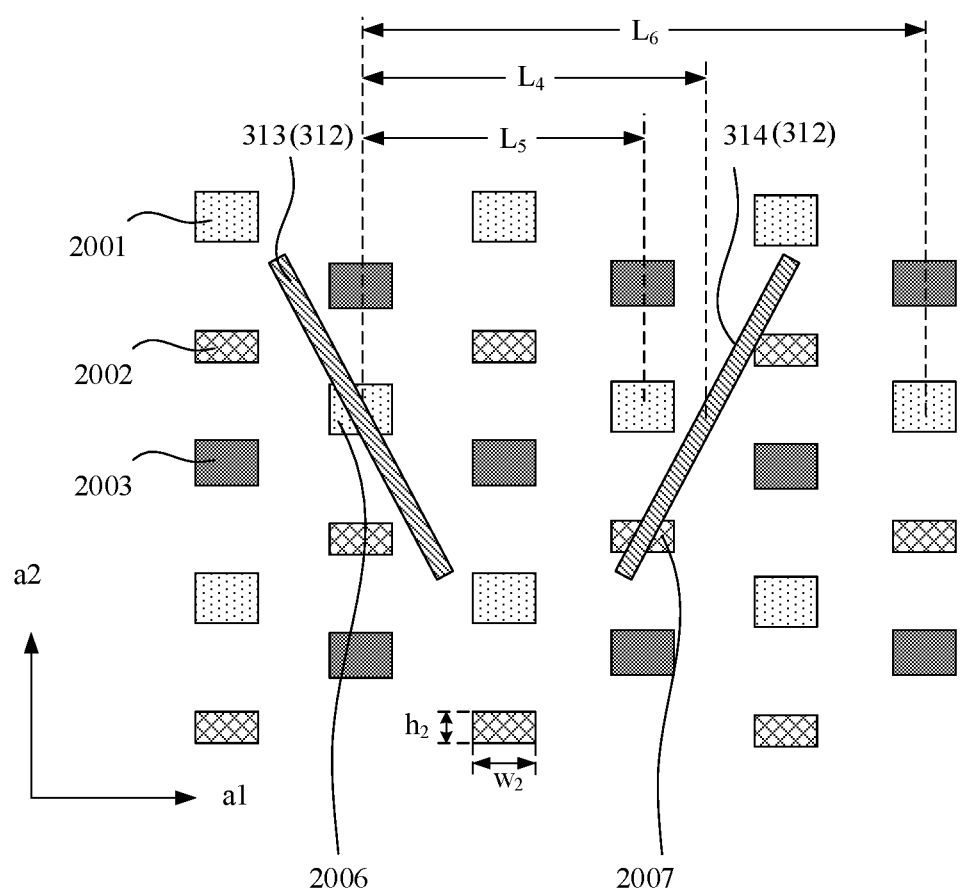
FIG. 23 is still another enlarged schematic view of a region A in FIG. 1 according to an embodiment of the present disclosure.

For example, FIG. 23 is still another enlarged schematic view of a region A in FIG. 1. In order to make the figure clearer, FIG. 23 only shows the pixel column and the bridge, and does not show the first touch electrode or the second touch electrode. In an embodiment of the present disclosure, the above second bridges 312 further include a fourth bridge 314, an orthographic projection of the fourth bridge 314 on the plane of the substrate 1 overlaps at least partially an orthographic projection, of the second subpixel 2002, on the plane of the substrate 1.

In an embodiment of the present disclosure, a quantity of fourth bridges 314 is less than a quantity of third bridges 313. That is, when the bridge is designed, the orthographic projection of the bridge on the plane of the substrate 1 is preferentially set to overlap the first subpixel 2001. Then, the orthographic projection of the bridge on the plane of the substrate 1 is set to overlap the second subpixel 2002.

In an embodiment, a center of the orthographic projection of the fourth bridge 314 on the plane of the substrate 1 coincides with a center of the orthographic projection of the second subpixel 2002 on the plane of the substrate 1.

For example, the third bridge 313 and the fourth bridge 314 can belong to a same bridge group. In other words, the third bridge 313 and the fourth bridge 314 are connected in parallel to two adjacent first touch electrodes 32. As shown in FIG. 4 and FIG. 23, in a same bridge group, for a distance between the adjacent third bridge 313 and fourth bridge 314, a distance between two adjacent second touch electrodes 42 in the second touch unit 40, and a shape of the connection portion 41 between the two adjacent second touch electrodes 42 can be taken into account. As shown in FIG. 23, when a distance $L_4$ between the center of the orthographic projection of the third bridge 313 on the plane of the substrate 1 and the center of the orthographic projection of the fourth bridge 314 on the plane of the substrate 1 is greater than a distance $L_5$ between two adjacent first subpixels 2001 along the first direction a1 and smaller than a distance $L_6$ between a $1^{st}$ first subpixel and a $3^{rd}$ first subpixel in three adjacent first subpixels along the first direction a1, and it is ensured that the third bridge 313 to overlaps the first subpixel 2001, the distance between the third bridge 313 and the fourth bridge 314 can be ensured by setting the fourth bridge 314 to overlap the second subpixel 2002.

Figure 24:
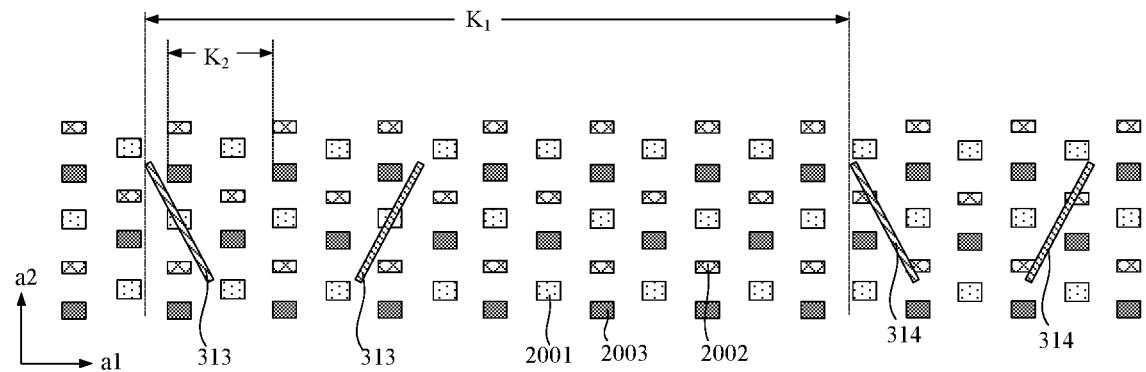
FIG. 24 is still another enlarged schematic view of a region A in FIG. 1 according to an embodiment of the present disclosure.

In an embodiment of the present disclosure, the fourth bridge 314 and the third bridge 313 can belong to different bridge groups. FIG. 24 is still another enlarged schematic view of a region A in FIG. 1. In order to make the figure clearer, FIG. 24 only shows the pixel column and the bridge, and does not show the first touch electrode or the second touch electrode. The fourth bridge 314 and the third bridge 313 belong to different bridge groups. The fourth bridge 314 and the third bridge 313 can belong to different first touch units.

In an embodiment of the present disclosure, the orthographic projection of the fourth bridge 314 on the plane of the substrate 1 at least partially overlaps the orthographic projection of the second subpixel 2002 on the plane of the substrate 1, so that the fourth bridge 314 can be arranged to keep away from the third subpixel 2003 with relatively high brightness, which can reduce visibility of the fourth bridge 314, and improve the display effect of the display panel.

For example, as shown in FIG. 23, in an embodiment of the present disclosure, a length $w_2$, along the first direction a1, of the second subpixel 2002 is greater than a length $h_2$, along the second direction a2, of the second subpixel 2002. When the orthographic projection of the fourth bridge 314 on the plane of the substrate 1 overlaps the orthographic projection of the second subpixel 2002 on the plane of the substrate 1, the fourth bridge 314 can overlap a long side of the second subpixel 2002, so that area, shaded by the fourth bridge 314, of the second subpixel 2002 accounts for a small proportion of total area of the second subpixel 2002, thereby reducing the visibility of the third bridge 314.

For example, a width of the fourth bridge 314 is f, the length, along the first direction a1, of the second subpixel 2002 is $w_2$, and $f/(w_2 \cos \alpha) < 20\%$. When the orthographic projection of the fourth bridge 314 on the plane of the substrate 1 overlaps the second subpixel 2002, as shown in FIG. 15, the overlapping area $S_{3142}$ of the fourth bridge 314 and the second subpixel 2002 can satisfy the following condition:

$$S_{3142} = (f/\cos \alpha) \times h_2 \qquad (1).$$

The area $S_{2002}$ of the second subpixel 2002 can satisfy the following condition:

$$S_{2002} = w_2 h_2 \qquad (2).$$

In an embodiment of the present disclosure, $f/(w_2 \cos \alpha) < 20\%$. Therefore, it can be calculated that the proportion $S_{3142}/S_{2002}$ of the overlapping area $S_{3142}$ to the area $S_{2002}$ of the second subpixel 2002 can satisfy the following condition: $S_{3142}/S_{2002} < 20\%$. In this way, the proportion of the area, shaded by the fourth bridge 314, of the second subpixel 2002 to the total area of the second subpixel 2002 can be reduced, thereby reducing the visibility of the fourth bridge 314.

For example, the length, along the second direction a2, of the second subpixel 2002 is $h_2$, and $h_2/\cos \alpha < 29$ μm. As shown in FIG. 15, the length $L_{3142}$, shaded by the fourth bridge 314, of the second subpixel 2002 can satisfy the following condition: $L_{3142} = h_2/\cos \alpha$. In the embodiment of the present disclosure, $h_2/\cos \alpha < 29$ μm, which can make the length, shaded by the fourth bridge 314 of the second subpixel 2002 smaller than the distinguishable length of the human eye, and can make the fourth bridge 314 almost invisible.

Figure 25:
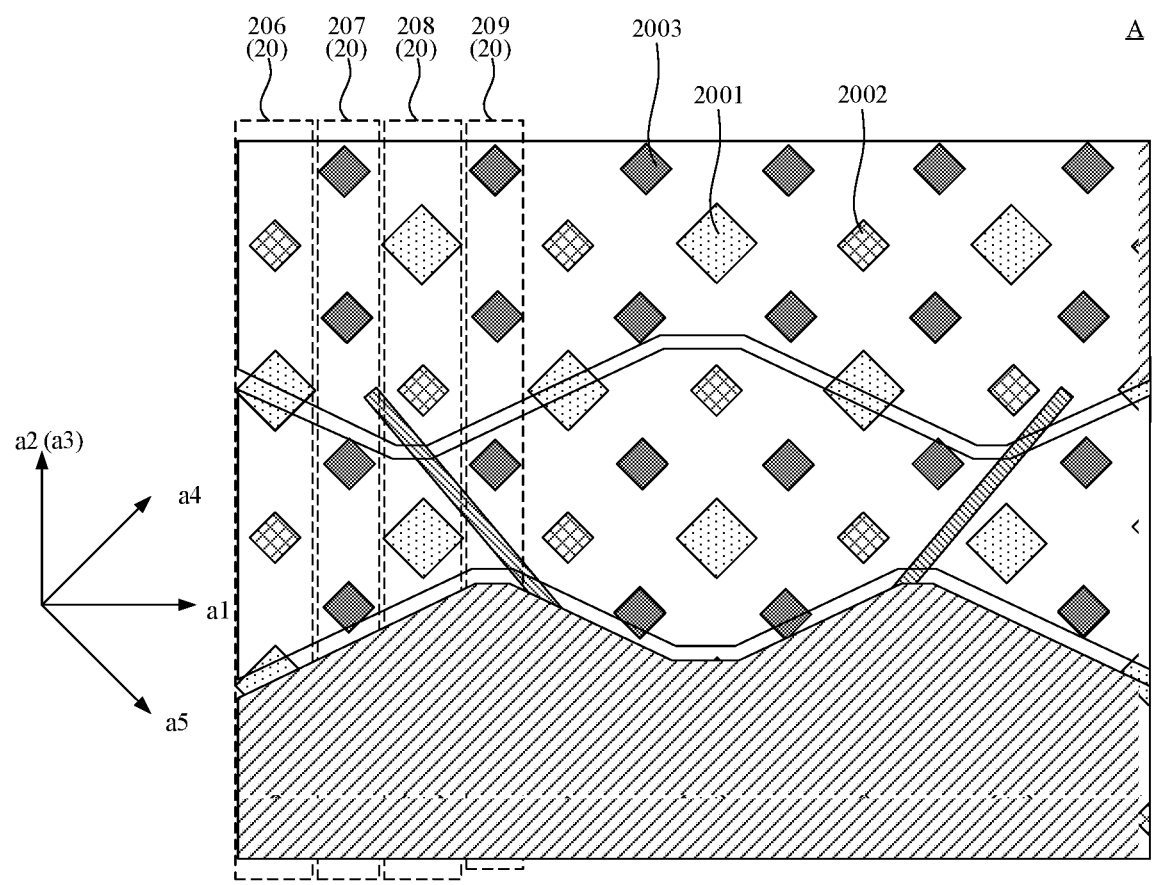
FIG. 25 is still another enlarged schematic view of a region A in FIG. 1 according to an embodiment of the present disclosure.
Figure 26:
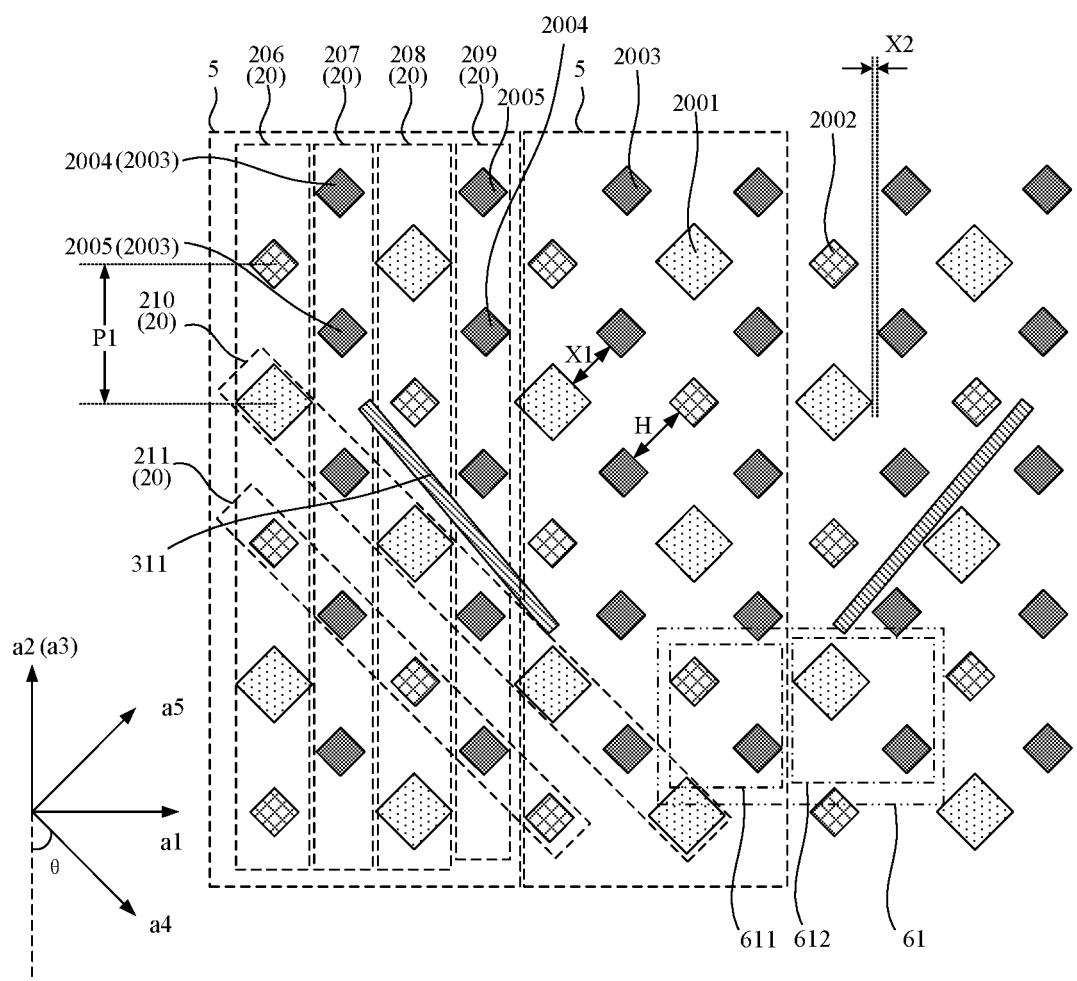
FIG. 26 is a schematic view of FIG. 25 without a first touch electrode and a second touch electrode according to an embodiment of the present disclosure.

FIG. 25 is still another enlarged schematic view of a region A in FIG. 1, and FIG. 26 is a schematic view of FIG. 25 without a first touch electrode and a second touch electrode. In an embodiment, as shown in FIG. 25 and FIG. 26, the pixel columns 20 include a sixth pixel column 206, a seventh pixel column 207, an eighth pixel column 208, and a ninth pixel column 209 that are sequentially arranged along the first direction a1 And that constitute a minimum pixel repeating unit column group 5, and minimum pixel repeating unit column groups 5 are sequentially arranged along the first direction a1.

In an embodiment, the sixth pixel column 206 and the eighth pixel column 208 each include a first subpixel 2001 and a second subpixel 2002 that are alternately arranged along the second direction a2, a distance between centers of the adjacent first subpixel 2001 and second subpixel 2002 along the second direction a2 is P1, And the sixth pixel column 206 and the eighth pixel column 208 are disposed with a spacing of P1 in the first direction a1.

In an embodiment, the seventh pixel column 207 and the ninth pixel column 209 each include a third subpixel 2003 arranged along the second direction a2, the third subpixel 2003 includes a fourth subpixel 2004 and a fifth subpixel 2005, and the fourth subpixel 2004 and the fifth subpixel 2005 have a same emitting color; and in the seventh pixel column 207 and the ninth pixel column 209, the fourth subpixel 2004 and the fifth subpixel 2005 are alternately arranged along the second direction a2, and the fourth subpixel 2004 and the fifth subpixel 2005 are aligned along the first direction a1.

For example, area of the first subpixel 2001 is greater than area of the second subpixel 2002, and the area of the first subpixel 2001 is greater than that of the third subpixel 2003. In this embodiment of the present disclosure, the first subpixel can be a blue subpixel emitting blue light, the second subpixel can be a red subpixel emitting red light, and the third subpixel can be a green subpixel emitting green light. When the display panel is an organic light emitting display panel, a blue light emitting material has a relatively short service life and a relatively low light emitting efficiency. In an embodiment of the present disclosure, relatively large area is set for the blue subpixel, so that light emitting effects of subpixels of different colors can be balanced.

In an embodiment, as shown in FIG. 26, a straight line connecting the fourth subpixel 2004 in the seventh pixel column 207 and the first subpixel 2001, closest to the fourth subpixel 2004 in the seventh pixel column 207, in the sixth pixel column 206 is parallel to a fourth direction a4, and an acute angle is formed between the fourth direction a4 and the first direction a1. In other words, as shown in FIG. 26, the display panel can be regarded to include a tenth pixel column 210 extending along the fourth direction a4. The tenth pixel column 210 can include the first subpixel 2001 and the fourth subpixel 2004 that are alternately arranged along the fourth direction a4. A straight line connecting the fourth subpixel 2004 in the seventh pixel column 207 and the second subpixel 2002, closest to the fourth subpixel 2004 in the seventh pixel column 207, in the sixth pixel column 206 is parallel to a fifth direction a5, and an acute angle is formed between the fifth direction a5 and the first direction a1. The fifth direction a5 and the fourth direction a4 intersect.

Similarly, in an embodiment, a straight line connecting the fifth subpixel 2005 in the seventh pixel column 207 and the second subpixel 2002, closest to the fifth subpixel 2005 in the seventh pixel column 207, in the sixth pixel column 206 is parallel to the fourth direction a4. In other words, as shown in FIG. 26, the display panel can be regarded to further include an eleventh pixel column 211. The eleventh pixel column 211 can include the second subpixel 2002 and the fifth subpixel 2005 that are alternately arranged along the fourth direction a4. The tenth pixel column 210 and the eleventh pixel column 211 are alternately arranged along the fifth direction a5.

The straight line connecting the fourth subpixel 2004 and the first subpixel 2001 is a straight line connecting a center of an orthographic projection of the fourth subpixel 2004 on the plane of the substrate 1 and a center of an orthographic projection of the first subpixel 2001 on the plane of the substrate 1.

The above arrangement of the organic light emitting device can be referred to as a diamond arrangement. As shown in FIG. 26, for the display panel using such arrangement, a pixel unit 61 can include a first subpixel unit 611 and a second subpixel unit 612, the first subpixel unit 611 includes the second subpixel 2002 and the third subpixel 2003, and the second subpixel unit 612 includes the first subpixel 2001 and the third subpixel 2003, to display a color. Such pixel arrangement, together with a corresponding pixel rendering method, can be used to increase a quantity of pixels per inch (PPI) in the display panel based on a limited quantity of pixels, so that the display panel can achieve high-PPI displaying.

For the display panel based on the pixel arrangement rule shown in FIG. 26, when a position of the bridge is set, a first bridge 311 can be disposed in the bridge, and an orthographic projection of the first bridge 311 on the plane of the substrate 1 can be arranged between orthographic projections of the adjacent tenth pixel column 210 and eleventh pixel column 211 along the fifth direction on the plane of the substrate 1.

For example, as shown in FIG. 26, a shortest distance between the adjacent tenth pixel column 210 and eleventh pixel column 211 along the fifth direction a5 is X1, a shortest distance between any two adjacent pixel columns along the first direction a1 is X2, that is, a shortest distance between the adjacent sixth pixel column 206 and seventh pixel column 207, a shortest distance between the adjacent seventh pixel column 207 and eighth pixel column 208, a shortest distance between the adjacent eighth pixel column 208 and ninth pixel column 209, and a shortest distance between the adjacent ninth pixel column 209 and sixth pixel column 206 are all X2. In an embodiment of the present disclosure, $X2 \geq X1$.

Figure 27:
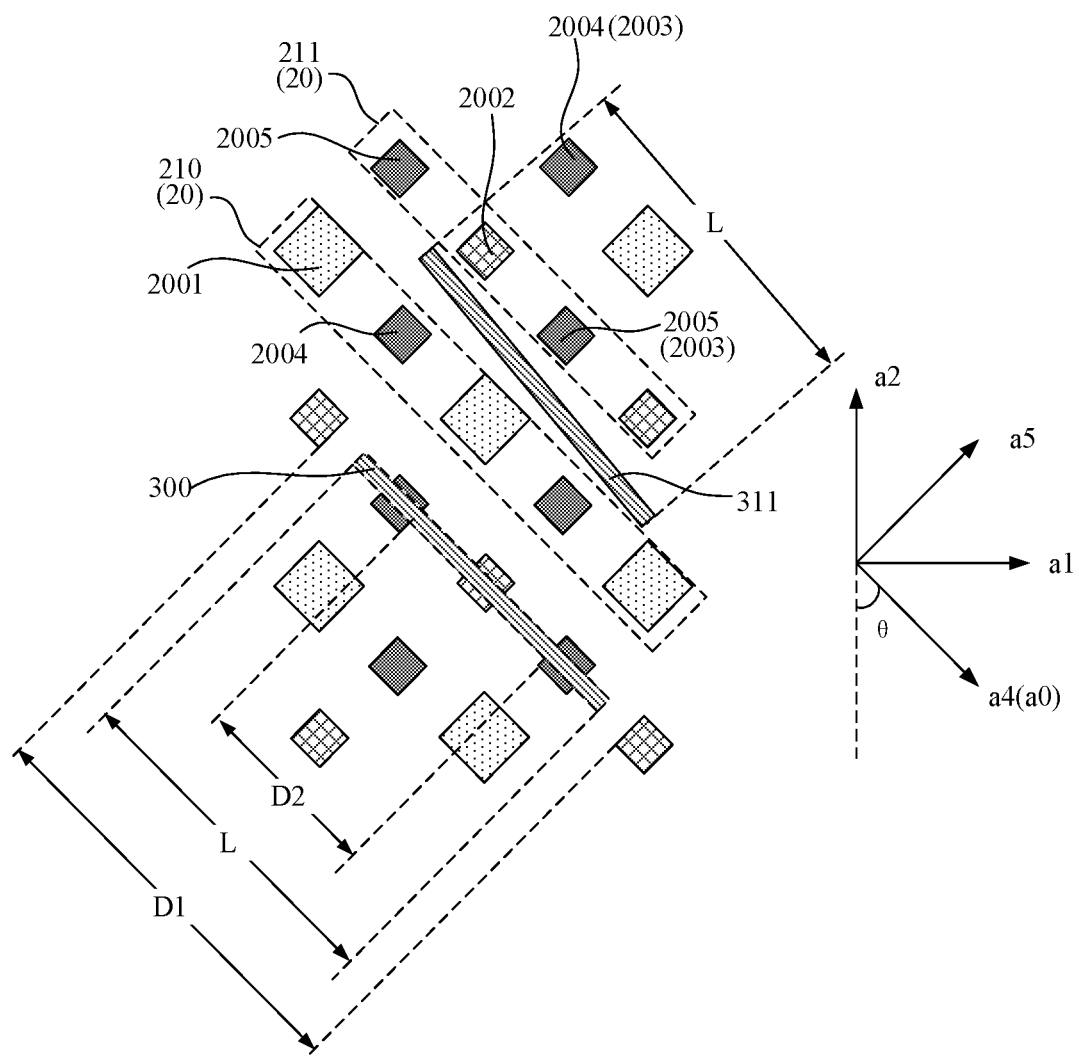
FIG. 27 is a schematic view of comparing relative position relationships between a subpixel satisfying an arrangement rule shown in FIG. 26 and two types of different bridges according to an embodiment of the present disclosure.

FIG. 27 is a schematic view of comparing relative position relationships between a subpixel satisfying the arrangement rule shown in FIG. 26 and two types of different bridges. To make a distinction, in FIG. 27, the contrast bridge 300 extending along the preset direction a0 is indicated by a dotted-line border, and the first bridge 311 provided in this embodiment of the present disclosure is indicated by a solid-line border. Lengths of the contrast bridge 300 and the first bridge 311 are L. In FIG. 27, for example, the preset direction a0 is parallel to the fourth direction a4, and N=5. The length L of the bridge 31, a distance D1 between the second edge 22 of a $1^{st}$ subpixel 200 and the first edge 21 of a $5^{th}$ subpixel 200 in five subpixels 200 sequentially arranged along the preset direction a0, and a distance D2 between the second edge 22 of a $2^{nd}$ subpixel 200 and the first edge 21 of a $4^{th}$ subpixel 200 in the five subpixels 200 sequentially arranged along the preset direction a0 can satisfy the following condition: D2≤L≤D1. In an embodiment of the present disclosure, it can be learned by comparing the first bridge 311 and the contrast bridge 300 that M=0 can be realized by disposing the first bridge 311 between the adjacent tenth pixel column 210 and eleventh pixel column 211 along the fifth direction a5, so as to minimize a quantity of subpixels overlapping the first bridge 311 and reduce visibility of the first bridge 311.

For example, as shown in FIG. 26, a center of the orthographic projection of the first bridge 311 on the plane of the substrate 1 is located on a straight line connecting the center of the first subpixel 2001 and a center of the fifth subpixel 2005 closest to the first subpixel 2001, and a distance between a center of the first bridge 311 and the center of the first subpixel 2001 is equal to a distance between the center of the first bridge 311 and the center of the fifth subpixel 2005. In an embodiment of the present disclosure, the area of the first subpixel 2001 is relatively large. Therefore, if an end portion of the first bridge 311 is designed to be close to the first subpixel 2001, if a process deviation occurs on a tilt angle of the first bridge 311, the first bridge 311 easily overlaps the first subpixel 2001. In the embodiment of the present disclosure, the center of the first bridge 311 is designed to be close to the first subpixel 2001. In this way, the tilt angle of the first bridge 311 can be designed within a relatively large angle range, and it can be ensured that the orthographic projection, of the first bridge 311, on the plane of the substrate 1 does not overlap with any subpixel.

Figure 28:
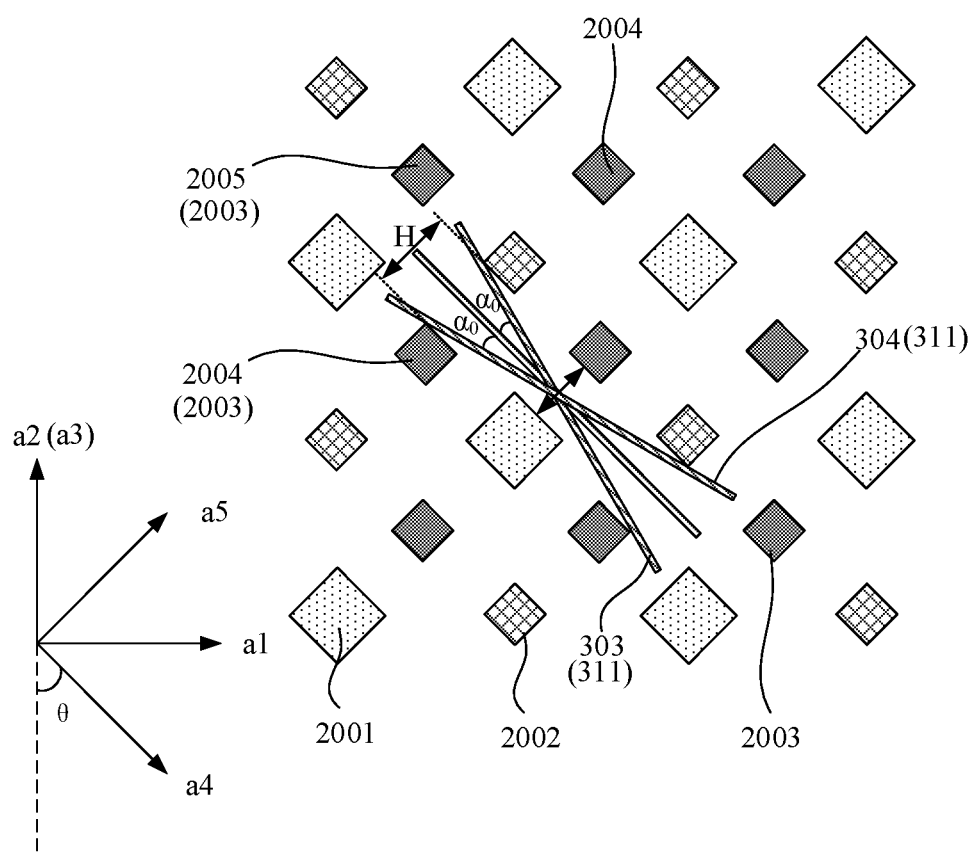
FIG. 28 is still another enlarged schematic view of a region A in FIG. 1 according to an embodiment of the present disclosure.

FIG. 28 is still another enlarged schematic view of a region A in FIG. 1. As shown in FIG. 28, an acute angle θ is formed between the fourth direction a4 and the second direction a2, and a shortest distance between the fourth subpixel 2004 and the second subpixel 2002 closest to the fourth subpixel 2004 is H. In an embodiment of the present disclosure, $\alpha_3 \leq \alpha \leq \alpha_4$, $\alpha_3 = \theta - \alpha_0$, and $\alpha_4 = \theta + \alpha_0$, where $\alpha_0 = \arcsin(H/L)$. In this way, the quantity of subpixels overlapping the first bridge 311 can be minimized.

When $\alpha = \theta - \alpha_0$, as shown in FIG. 28, the first bridge 311 is at a position indicated by 303. At the position 303, the first bridge 311 does not overlap any subpixel, and one part of the first bridge 311 is infinitely close to the second subpixel 2002. In an embodiment of the present disclosure, an angle α between the first bridge 311 and the second direction a2 is set to be greater than or equal to $\theta - \alpha_0$, which can prevent the first bridge 311 from overlapping the second subpixel 2002.

When $\alpha = \theta + \alpha_0$, as shown in FIG. 28, the first bridge is at a position indicated by 304. At the position 304, the first bridge 311 does not overlap any subpixel, and one part of the first bridge 311 is infinitely close to the third subpixel 2003. In an embodiment of the present disclosure, the angle α between the first bridge 311 and the second direction a2 is set to be smaller than or equal to $\theta + \alpha_0$, which can prevent the first bridge 311 from overlapping the third subpixel 2003.

In conclusion, in an embodiment of the present disclosure, $\theta - \alpha_0 \leq \alpha < \theta + \alpha_0$, and the center of the orthographic projection of the first bridge on the plane of the substrate 1 can be located on the straight line connecting the center of the first subpixel 2001 and the center of the fifth subpixel 2005 closest to the first subpixel 2001, which can ensure that the first bridge 311 does not overlap any subpixel, to minimize the visibility of the first bridge 311.

For example, in an embodiment of the present disclosure, $\alpha \neq \theta$, in other words, the first bridge 311 is not parallel to the fourth direction a4. In this way, if the alignment of the display layer 2 and the touch layer 3 deviates in a process of manufacturing the display panel, the first bridge 311 will not overlap a plurality of adjacent subpixels in a same tenth pixel column 210 or eleventh pixel column 211. In other words, in the embodiment of the present disclosure, the alignment precision requirements of the display layer and the touch layer can be lowered by setting $\alpha \neq \theta$, which reduces the process difficulty and production costs.

For example, θ can be 45°.

Figure 29:
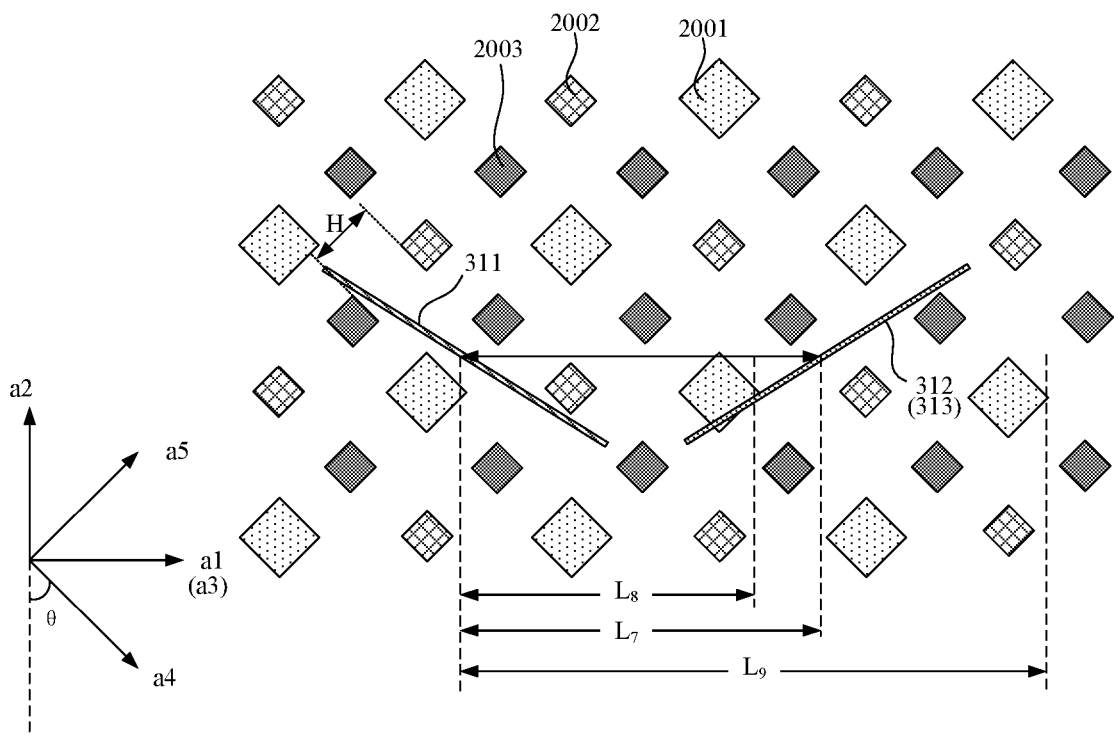
FIG. 29 is still another enlarged schematic view of a region A in FIG. 1 according to an embodiment of the present disclosure.

FIG. 29 is still another enlarged schematic view of a region A in FIG. 1. In order to make the figure clearer, FIG. 29 only shows the pixel column and the bridge, and does not show the first touch electrode or the second touch electrode. In an embodiment of the present disclosure, the bridges further include a second bridge 312, and an orthographic projection of the second bridge 312 on the plane of the substrate overlaps an orthographic projection of one subpixel on the plane of the display panel.

In an embodiment, the second bridge 312 and the first bridge 311 can belong to a same bridge group. That is, the first bridge 311 and the second bridge 312 are connected in parallel to two adjacent first touch electrodes 32. As shown in FIG. 4, in a same bridge group, for a distance between the adjacent first bridge 311 and second bridge 312, a distance between two adjacent second touch electrodes 42 in the second touch unit 40, and a shape of the connection portion 41 between the two adjacent second touch electrodes 42 need to be considered. When a distance $L_7$ between the center of the first bridge 311 and a center of the second bridge 312 is greater than a distance $L_8$ between two adjacent first subpixels 2001 along the first direction a1 and smaller than a distance $L_9$ between centers of $1^{st}$ and $3^{rd}$ first subpixels in three adjacent first subpixels along the first direction a1, an embodiment of the present disclosure ensures, by setting the orthographic projection of the second bridge 312 on the plane of the substrate 1 to overlap an orthographic projection of one subpixel on the plane of the substrate, that there is the required distance between the first bridge 311 and the second bridge 312, while ensuring that the orthographic projection of the first bridge 311 on the plane of the substrate 1 does not overlap any subpixel. In an embodiment of the present disclosure, the second bridge 312 whose orthographic projection on the plane of the substrate 1 overlaps one subpixel is disposed in the display panel. In this way, when a length of the second bridge fame 312 is determined, a distance between the adjacent tenth pixel column and eleventh pixel column that are located on two sides of the second bridge 312 and that are along the fifth direction a5 can be set to a small value, which can improve a resolution of the display panel on the basis of reducing visibility of the second bridge.

Figure 30:
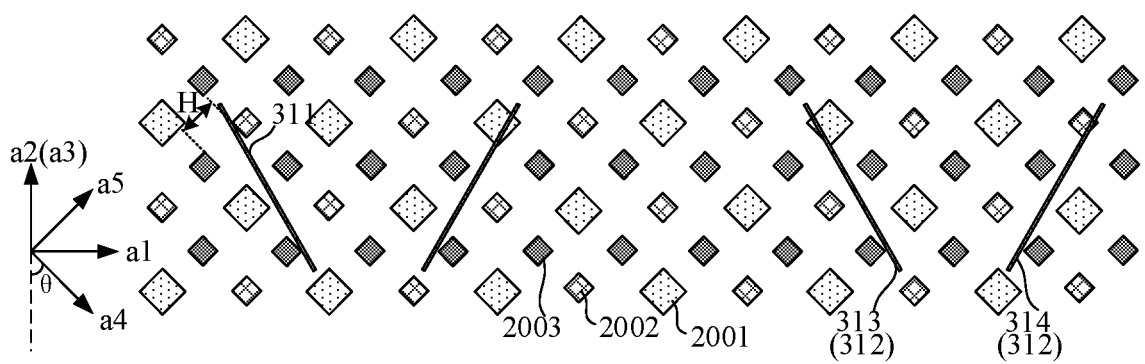
FIG. 30 is still another enlarged schematic view of a region A in FIG. 1 according to an embodiment of the present disclosure.

In an embodiment of the present disclosure, the second bridge 312 and the first bridge 311 can belong to different bridge groups. FIG. 30 is still another enlarged schematic view of a region A in FIG. 1. In order to make the figure clearer, FIG. 30 only shows the pixel column and the bridge, and does not show the first touch electrode or the second touch electrode. The second bridge 312 and the first bridge 311 belong to different bridge groups. The second bridge 312 and the first bridge 311 belong to different first touch units (not shown in FIG. 30).

In an embodiment of the present disclosure, a quantity of first bridges 311 is greater than that of second bridges 312. In other words, when a position of the bridge is set, the orthographic projection of the bridge on the plane of the substrate 1 is preferentially set to be between the adjacent tenth pixel column 210 and eleventh pixel column 211. Then, the orthographic projection of the bridge on the plane of the substrate 1 overlaps the subpixel.

In an embodiment of the present disclosure, as shown in FIG. 30, the above second bridges 312 includes a third bridge 313 and a fourth bridge 314. An orthographic projection of the third bridge 313 on the plane of the substrate 1 overlaps the first subpixel 2001, and an orthographic projection, of the fourth bridge 314 on the plane of the substrate 1 overlaps the second subpixel 2002. In an embodiment, the first subpixel 2001 is a blue subpixel, the second subpixel 2002 is a red subpixel, and the third subpixel 2003 is a green subpixel. When a white screen is synthesized, among the subpixels emitting the red, green, and blue light, the blue subpixel has lowest brightness and the green subpixel has highest brightness. In an embodiment of the present disclosure, the orthographic projection of the third bridge 313 on the plane of the substrate overlaps an orthographic projection of the blue subpixel with lower brightness on the plane of the substrate, and the orthographic projection of the fourth bridge 314 on the plane of the substrate 1 overlaps an orthographic projection of the red subpixel with lower brightness on the plane of the substrate 1. Compared with the green subpixel, a brightness change of the blue subpixel 2001 after the blue subpixel 2001 is shaded by the third bridge 313, and a brightness change of the red subpixel 2002 after the red subpixel 2002 is shaded by the fourth bridge 314 are more difficult to be detected by the human eye, which reduce visibility of the third bridge 313 and the fourth bridge 314.

In an embodiment of the present disclosure, a quantity of third bridges 3121 is greater than that of fourth bridges 314. When the position of the bridge is set, on the basis that the orthographic projection of the bridge on the plane of the substrate 1 can be arranged between the adjacent tenth pixel column and eleventh pixel column, if another design requirement is considered, the orthographic projection of the bridge on the plane of the substrate 1 can overlap one subpixel. The orthographic projection of the bridge on the plane of the substrate 1 can overlap the first subpixel 2001, and then overlap the second subpixel 2002.

In an embodiment, the third bridge and the first bridge can belong to a same bridge group or different bridge groups, and the fourth bridge and the first bridge can belong to a same bridge group or different bridge groups, which is not limited in this embodiment of the present disclosure.

Figure 31:
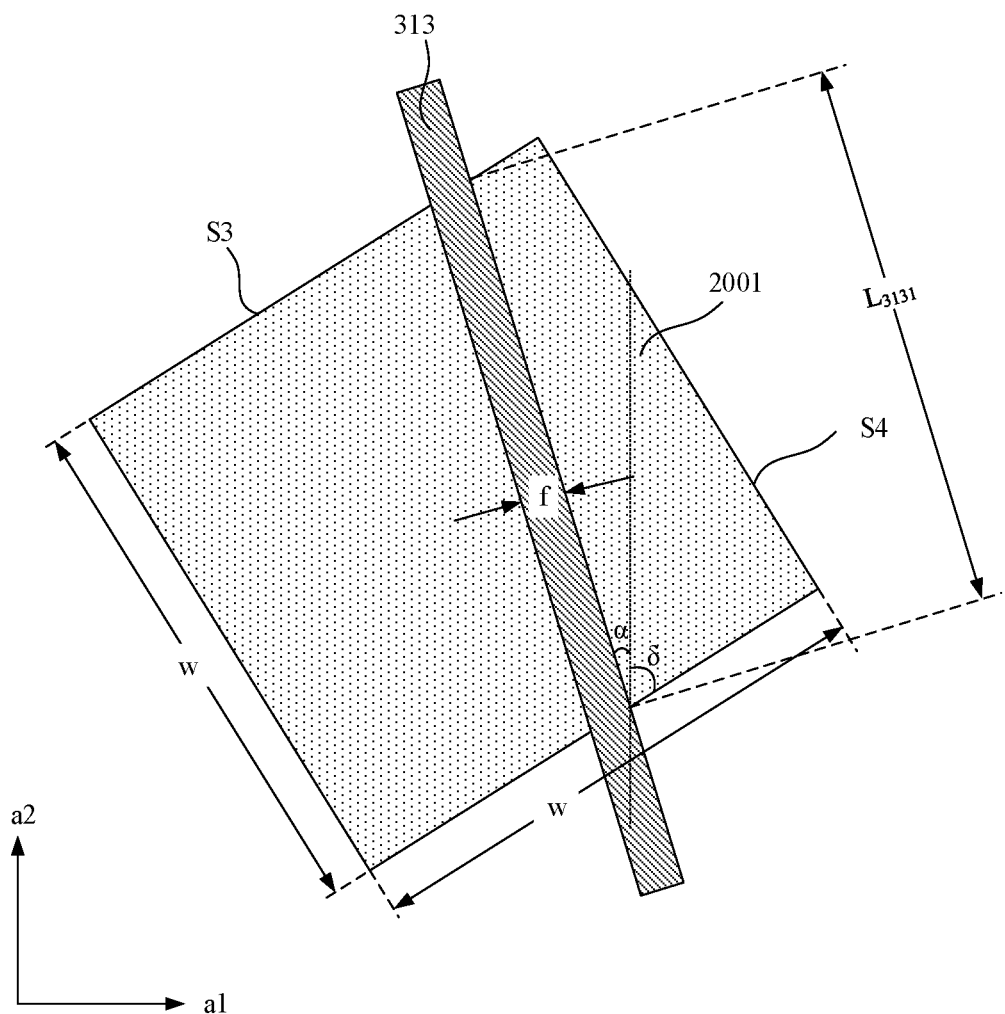
FIG. 31 is a schematic view of overlapping between a third bridge and a first subpixel.

FIG. 31 is a schematic diagram of overlapping between a third bridge and a first subpixel. In an embodiment, as shown in FIG. 31, the orthographic projection of the first subpixel 2001 on the plane of the substrate 1 has a square shape, a length of a side of the square shape is w, the square shape includes a third edge S3 and a fourth edge S4 that intersect, and an acute angle δ is formed between the third edge S3 and the second direction a2. For example, δ can be 45°.

In an embodiment, a width of the third bridge 313 is f, where f/[w×sin(α+δ)]<20%. When the orthographic projection, of the third bridge 313, on the plane of the substrate overlaps the first subpixel 2001, as shown in FIG. 31, overlapping area $S_0$ of the third bridge 313 and the first subpixel 2001 can satisfy the following condition:

$$S_{3131}=[f/\sin(\alpha+\delta)]\times w \qquad (1).$$

The area $S_{2001}$ of the first subpixel can satisfy the following condition:

$$S_{2001}=w^2 \qquad (2).$$

In an embodiment of the present disclosure, f/[w×sin(α+δ)]<20%. Therefore, it can be calculated that a proportion $S_{3131}/S_{2001}$ of the overlapping area $S_{3131}$ to the area $S_{2001}$ of the first subpixel satisfies the following condition: $S_{3131}/S_{2001}<20\%$. In this way, the visibility of the third bridge 313 can be reduced. When the bridge is designed, the above angles α and δ can be set accordingly.

For example, in an embodiment of the present disclosure, w/sin(δ+α)<29 μm. As shown in FIG. 31, a length $L_{3131}$, shaded by the third bridge 313, of the first subpixel 2001 can satisfy the following condition: $L_{3131}=w/\sin(\delta+\alpha)$. In the embodiment of the present disclosure, w/sin(δ+α)<29 μm, which can make the length, shaded by the third bridge 313, of the first subpixel 2001 smaller than a distinguishable length for the human eyes, and can make the third bridge 313 almost invisible.

In an embodiment, as shown in FIG. 2 and FIG. 4, the bridge group includes two bridges 31, and two bridges 31 in a same bridge group are symmetrical with respect to a preset reference line. For example, the preset reference line extends along a direction parallel to the third direction a3. The preset reference line is indicated by DD' in FIG. 2 and FIG. 4.

In an embodiment of the present disclosure, there is at least one bridge group; in the bridge group, an orthographic projection of one of the two bridges on the plane of the substrate 1 at least partially overlaps an orthographic projection of a sixth subpixel on the plane of the substrate 1 and an orthographic projection of the other one of the two bridges on the plane of the substrate 1 at least partially overlaps an orthographic projection of a seventh subpixel on the plane of the substrate 1; And the first direction a1 intersects a straight line connecting the sixth subpixel and the seventh subpixel. In this way, subpixels shaded by two bridges in a same bridge group can be distributed in different pixel rows and pixel columns in the display panel, where the pixel row refers to a plurality of subpixels arranged along the first direction a1. In other words, the shaded subpixels are not distributed in a centralized manner, thereby reducing the visibility of the bridge.

For example, colors of the sixth subpixel and the seventh subpixel respectively shaded by the two bridges in the same bridge group can be the same or different, which is not limited in this embodiment of the present disclosure. For example, as shown in FIG. 23, the third bridge 313 and the fourth bridge 314 belong to a same bridge group, the first subpixel 2001 overlapping the third bridge 313 is the sixth subpixel 2006, and the second subpixel 2002 overlapping the fourth bridge 314 is the seventh subpixel 2007. It can be learned from FIG. 23 that the first subpixel 2001 overlapping the third bridge 313 is located in a different row and a different column from two second subpixels 2002 overlapping the fourth bridge 314.

In an embodiment of the present disclosure, as shown in FIG. 1, along the first direction a1, there are at least two first touch units 30, and a distance between two adjacent first touch units 30 is $K_1$, the distance between the two adjacent first touch units 30 is a distance between same parts of the two adjacent first touch units 30. For example, the distance between the two adjacent first touch units 30 can be represented by a distance between centers of the two adjacent first touch units. As shown in FIG. 3, a distance between two adjacent minimum pixel repeating unit column groups 5 is $K_2$. Similar to the distance between the two adjacent first touch units 30, the distance between the two adjacent minimum pixel repeating unit column groups 5 is a distance between same structures of the two adjacent minimum pixel repeating unit column groups 5. In an embodiment of the present disclosure, $K_1=s \times K_2$, where s is a non-integer greater than 0.

After a plurality of minimum pixel repeating unit column groups 5 in the display layer 2 constitute an array along the first direction a1, and a plurality of first touch units 30 in the touch layer 3 constitute an array along the third direction a3, s is set to the non-integer greater than 0 in an embodiment of the present disclosure, which can prevent bridges in different bridge groups from overlapping subpixels with a same color. For example, in FIG. 24, $K_1=s \times K_2$, where 6<s<7. It can be learned that, in FIG. 24, orthographic projections of two third bridges 313 in a $1^{st}$ bridge group on the plane of the substrate 1 overlap one first subpixel 2001 separately, and two fourth bridges 314 in a $2^{nd}$ bridge group overlap two second subpixels 2002 respectively. Compared with that all bridges overlap the first subpixel 2001, or all bridges overlap the second subpixel 2002, the configuration in the embodiment of the present disclosure allows the bridge to occlude subpixels of a plurality of colors, which not only makes it difficult to observe the bridge with the human eye, but also can mitigate a bad color shift of the display panel because all the bridges occlude subpixels of a certain color.

Figure 32:
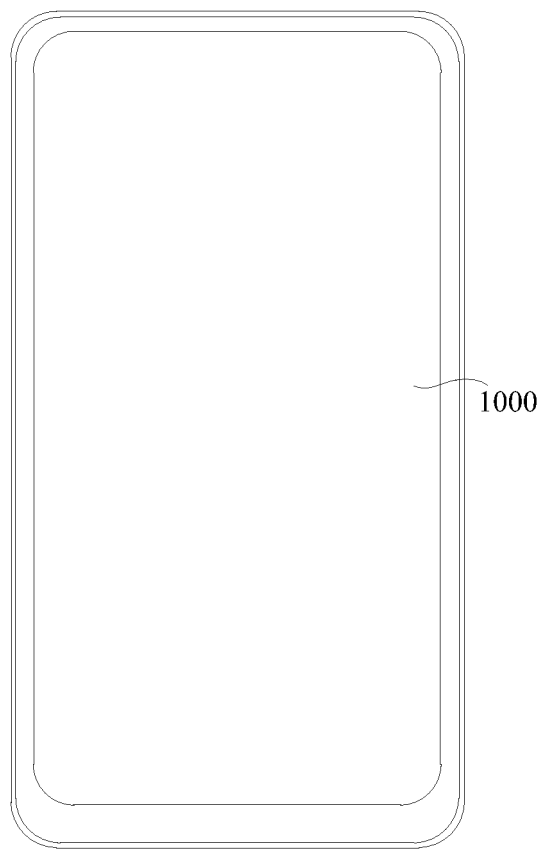
FIG. 32 is a schematic view of a display apparatus according to an embodiment of the present disclosure.

Some embodiments of the present disclosure further provide a display apparatus. FIG. 32 is a schematic view of a display apparatus according to an embodiment of the present disclosure. As shown in FIG. 32, the display apparatus includes the foregoing display panel 1000. A structure of the display panel 1000 has been described in detail in the foregoing embodiment, which will not be repeated herein. The display apparatus shown in FIG. 32 is for schematic description only. The display apparatus can be any electronic device with a display function, such as a mobile phone, a tablet computer, a notebook computer, an e-book, or a television.

The foregoing descriptions are some embodiments of the present disclosure and are not intended to limit this disclosure. Any modification, equivalent replacement, and improvement made within principle of the present disclosure shall fall within the protection scope of the present disclosure.

What is claimed is:

1. A display panel, comprising:
   a substrate;
   a display layer located on a side of the substrate, wherein the display layer comprises pixel columns arranged along a first direction, the pixel columns comprise subpixels, each of the pixel columns comprises at least two subpixels of the subpixels, the at least two subpixel are arranged along a second direction, and the first direction and the second direction intersect; and
   a touch layer located on a side of the display layer facing away from the substrate, wherein the touch layer comprises first touch units, each of the first touch units comprises a bridge group and at least two first touch electrodes, the at least two first touch electrodes are arranged along a third direction, the bridge group comprises at least one bridge, and one of the at least one bridge is electrically connected to two of the at least two first touch electrodes,
   wherein an acute angle α is formed between an extending direction of one of the at least one bridge and the second direction;
   for N subpixels of the subpixels sequentially arranged along a preset direction, each of the N subpixels comprises a first edge and a second edge that are oppositely disposed along the preset direction, and D2≤L≤D1, where D1 denotes a distance from the second edge of a $1^{st}$ subpixel of the N subpixels and the first edge of an $N^{th}$ subpixel of the N subpixels, D2 denotes a distance from the second edge of a $2^{nd}$ subpixel of the N subpixels to the first edge of an $(N-1)^{th}$ subpixel of the N subpixels, and L denotes a length of each of the at least one bridge;
   an orthographic projection of each of the at least one bridge on a plane of the substrate overlaps M subpixels of the subpixels, where 0≤M<(N-2), N is an integer greater than 2, and M is an integer; and
   the preset direction is parallel to the plane of the substrate.

2. The display panel according to claim 1, wherein the pixel columns comprise a first pixel column, a second pixel column, a third pixel column, and a fourth pixel column that are arranged along the first direction;
   the first pixel column and the third pixel column each comprise first subpixels of the subpixels, and the first subpixels are arranged along the second direction;
   the second pixel column and the fourth pixel column each comprise second subpixels and third subpixels that are alternately arranged along the second direction;
   a first gap is formed between two adjacent first subpixels of the first subpixels in the first pixel column, and one of the first subpixels, closest to the first gap, in the third pixel column at least partially overlaps the first gap in the first direction;
   a length $w_1$ of each of the first subpixels along the first direction is smaller than a length $w_2$ of each of the second subpixels along the first direction; and
   a length $h_1$ of each of the first subpixels along the second direction is greater than a length $h_2$ of each of the second subpixels along the second direction.

3. The display panel according to claim 2, wherein the orthographic projection of each of the at least one bridge on the plane of the substrate at least partially overlaps an orthographic projection of one of the first subpixels on the plane of the substrate.

4. The display panel according to claim 2, wherein each of the at least one bridge has a width f, where $f/(h_1 \sin α)<20\%$.

5. The display panel according to claim 2, wherein $w_1/\sin α<29$ μm.

6. The display panel according to claim 2, wherein the orthographic projection of each of the at least one bridge on the plane of the substrate at least partially overlaps an orthographic projection of one of the second subpixels on the plane of the substrate.

7. The display panel according to claim 6, wherein $h_2/\cos α<29$ μm.

8. The display panel according to claim 6, wherein each of the at least one bridge has a width f, and $f/(w_2 \cos α)<20\%$.

9. The display panel according to claim 2, wherein the at least one bridge comprises two bridges symmetrical with respect to a preset reference line;

an orthographic projection of one of the two bridges on the plane of the substrate at least partially overlaps an orthographic projection of a sixth subpixel on the plane of the substrate;

an orthographic projection of the other one of the two bridges on the plane of the substrate at least partially overlaps an orthographic projection of a seventh subpixel on the plane of the substrate; and the first direction and a straight line connecting the sixth subpixel and the seventh subpixel cross each other.

10. The display panel according to claim 1, wherein the pixel columns comprise fourth pixel columns and fifth pixel columns that are alternately arranged along the first direction;

each of the fourth pixel columns and the fifth pixel columns comprises first subpixels, second subpixels, and third subpixels, and one of the first subpixels, one of the second subpixels, and one of the third subpixels are sequentially arranged along the second direction, a shortest distance between one of the first subpixels and one of the third subpixels adjacent to the first subpixel is $d_1$, and a shortest distance between one of the fourth pixel columns and one of the fifth pixel columns adjacent to the fourth pixel column is $d_2$; and a second gap is formed between two adjacent subpixels of the subpixels located in one of the fourth pixel columns; and one of the subpixels, closest to the second gap, in the fifth pixel column at least partially overlaps the second gap in the first direction.

11. The display panel according to claim 10, wherein one of the first subpixels has a length $w_1$ along the first direction and a length $h_1$ along the second direction, and $\alpha_1 \leq \alpha \leq \alpha_2$, where $\alpha_1 = \arctan(w_1/(h_1+2d_1))$, and $\alpha_2 = \arcsin((w_1+2d_2)/L)$.

12. The display panel according to claim 10, wherein the orthographic projection of each of the at least one bridge on the plane of the substrate at least partially overlaps an orthographic projection of one of the first subpixels on the plane of the substrate.

13. The display panel according to claim 10, wherein one of the first subpixels has a length $h_1$ along the second direction, and $h_1/\cos \alpha < 29$ μm.

14. The display panel according to claim 10, wherein the at least one bridge comprises two bridges symmetrical with respect to a preset reference line;

an orthographic projection of one of the two bridges on the plane of the substrate at least partially overlaps an orthographic projection of a sixth subpixel on the plane of the substrate;

an orthographic projection of the other one of the two bridges on the plane of the substrate at least partially overlaps an orthographic projection of a seventh subpixel on the plane of the substrate; and the first direction and a straight line connecting the sixth subpixel and the seventh subpixel cross each other.

15. The display panel according to claim 10, wherein the orthographic projection of each of the at least one bridge on the plane of the substrate at least partially overlaps an orthographic projection of one of the second subpixels on the plane of the substrate.

16. The display panel according to claim 14, wherein one of the second subpixels has a length $h_2$ along the second direction, where $h_2/\cos \alpha < 29$ μm.

17. The display panel according to claim 14, wherein each of the at least one bridge has a width f, and each of the second subpixels has a length $w_2$ along the first direction, where $f/(w_2 \cos \alpha) < 20\%$.

18. The display panel according to claim 1, wherein the pixel columns comprise a sixth pixel column, a seventh pixel column, an eighth pixel column, and a ninth pixel column that are sequentially arranged along the first direction;

the sixth pixel column and the eighth pixel column each comprise first subpixels and second subpixels that are alternately arranged along the second direction;

the seventh pixel column and the ninth pixel column each comprise third subpixels arranged along the second direction, the third subpixels comprises fourth subpixels and fifth subpixels, the fourth subpixels and the fifth subpixels have a same color; the fourth subpixel and the fifth subpixel in each of the seventh pixel column and the ninth pixel column are alternately arranged along the second direction, and the fourth subpixel and the fifth subpixel at least partially overlap along the first direction;

a straight line connecting one of the fourth subpixels in the seventh pixel column with one of the first subpixels in the sixth pixel column closest to the fourth subpixel is parallel to a fourth direction, and an acute angle is formed between the fourth direction and the first direction; and a straight line connecting the fourth subpixel in the seventh pixel column with one of the second subpixels in the sixth pixel column closest to the fourth subpixel is parallel to a fifth direction, and an acute angle is formed between the fifth direction and the first direction.

19. The display panel according to claim 18, wherein an acute angle θ is formed between the fourth direction and the second direction, and a shortest distance between one of the fourth subpixels and one of the second subpixels closest to the fourth subpixel is H; and $\alpha_3 \leq \alpha \leq \alpha_4$, where $\alpha_3 = \theta - \arcsin(H/L)$, and $\alpha_4 = \theta + \arcsin(H/L)$.

20. The display panel according to claim 18, wherein an orthographic projection of one of the first subpixels on the plane of the substrate is in a square shape, the square shape has sides having a length of w, and an acute angle δ is formed between one of the sides and the second direction; and $w/\sin(\delta+\alpha) < 29$ μm.

21. The display panel according to claim 13, wherein the at least one bridge comprises two bridges symmetrical with respect to a preset reference line;

an orthographic projection of one of the two bridges on the plane of the substrate at least partially overlaps an orthographic projection of a sixth subpixel on the plane of the substrate;

an orthographic projection of the other one of the two bridges on the plane of the substrate at least partially overlaps an orthographic projection of a seventh subpixel on the plane of the substrate; and the first direction and a straight line connecting the sixth subpixel and the seventh subpixel cross each other.

22. The display panel according to claim 1, wherein the pixel columns comprise minimum pixel repeating unit column groups sequentially arranged in the first direction; and $K_1 = s \times K_2$, where $K_1$ denotes a distance between two adjacent first touch units of the first touch units along the first direction, $K_2$ denotes a distance between two adjacent minimum pixel repeating unit column groups of the minimum pixel repeating unit column groups along the first direction, and s is a non-integer greater than 0.

23. A display apparatus, comprising a display panel, wherein the display panel comprises:
a substrate;

a display layer located on a side of the substrate, wherein the display layer comprises pixel columns arranged along a first direction, the pixel columns comprise subpixels, each of the pixel columns comprises at least two subpixels of the subpixels, the at least two subpixel are arranged along a second direction, and the first direction and the second direction intersect; and a touch layer located on a side of the display layer facing away from the substrate, wherein the touch layer comprises first touch units, each of the first touch units comprises a bridge group and at least two first touch electrodes, the at least two first touch electrodes are arranged along a third direction, the bridge group comprises at least one bridge, and one of the at least one bridge is electrically connected to two of the at least two first touch electrodes, wherein an acute angle $\alpha$ is formed between an extending direction of one of the at least one bridge and the second direction;

wherein for N subpixels of the subpixels sequentially arranged along a preset direction, each of the N subpixels comprises a first edge and a second edge that are oppositely disposed along the preset direction, and $D2 \leq L \leq D1$, where D1 denotes a distance from the second edge of a $1^{st}$ subpixel of the N subpixels and the first edge of an $N^{th}$ subpixel of the N subpixels, D2 denotes a distance from the second edge of a $2^{nd}$ subpixel of the N subpixels to the first edge of an $(N-1)^{th}$ subpixel of the N subpixels, and L denotes a length of each of the at least one bridge;

wherein an orthographic projection of each of the at least one bridge on a plane of the substrate overlaps M subpixels of the subpixels, where $0 \leq M < (N-2)$, N is an integer greater than 2, and M is an integer; and wherein the preset direction is parallel to the plane of the substrate.

* * * * *